(12) United States Patent
Sugimoto et al.

(10) Patent No.: US 10,910,358 B2
(45) Date of Patent: Feb. 2, 2021

(54) INTEGRATED ASSEMBLIES HAVING CAPACITIVE UNITS, AND HAVING RESISTIVE STRUCTURES COUPLED WITH THE CAPACITIVE UNITS

(71) Applicant: Micron Technology, Inc., Boise, ID (US)

(72) Inventors: Satoru Sugimoto, Kanagawa (JP); Hiroki Hosaka, Kanagawa (JP); Hayato Oishi, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 189 days.

(21) Appl. No.: 16/262,087

(22) Filed: Jan. 30, 2019

(65) Prior Publication Data
US 2020/0243501 A1 Jul. 30, 2020

(51) Int. Cl.
| | | |
|---|---|---|
| *H01L 29/92* | (2006.01) |
| *H01L 29/86* | (2006.01) |
| *H01L 23/50* | (2006.01) |
| *H01L 27/01* | (2006.01) |
| *H01L 23/522* | (2006.01) |
| *H01L 27/06* | (2006.01) |

(52) U.S. Cl.
CPC .......... *H01L 27/01* (2013.01); *H01L 23/5223* (2013.01); *H01L 23/5226* (2013.01); *H01L 27/0688* (2013.01)

(58) Field of Classification Search
CPC ............. H01L 23/5223; H01L 23/5226; H01L 23/5228; H01L 23/528; H01L 27/0682; H01L 27/0688
See application file for complete search history.

(56) References Cited

U.S. PATENT DOCUMENTS

| | | | | |
|---|---|---|---|---|
| 7,903,427 | B2* | 3/2011 | Itoh | H01L 27/0682 361/766 |
| 9,064,719 | B1* | 6/2015 | Zhou | H01L 27/0682 |
| 9,312,221 | B2* | 4/2016 | Yen | H01L 29/66166 |
| 10,115,719 | B2* | 10/2018 | Singh | H01L 28/40 |
| 2007/0045652 | A1* | 3/2007 | Kurata | H01L 28/55 257/103 |
| 2009/0309186 | A1* | 12/2009 | Inoue | H01L 23/5223 257/532 |

* cited by examiner

*Primary Examiner* — David C Spalla
(74) *Attorney, Agent, or Firm* — Wells St. John P.S.

(57) ABSTRACT

Some embodiments include an integrated assembly having a capacitive unit which includes a plurality of capacitive subunits. A first conductive structure is under a first group of the capacitive subunits and is coupled with them. A second conductive structure is under a second group of the capacitive subunits and is coupled with them. A third conductive structure is over the capacitive subunits and is coupled with all of the capacitive subunits. A resistive structure extends under the first and second conductive structures. The resistive structure has a first-end-region under the first conductive structure and coupled with the first conductive structure. The resistive structure includes resistive lines extending from the first-end-region to second-end-regions.

25 Claims, 20 Drawing Sheets

INTEGRATED ASSEMBLIES HAVING CAPACITIVE UNITS, AND HAVING RESISTIVE STRUCTURES COUPLED WITH THE CAPACITIVE UNITS

TECHNICAL FIELD

Integrated assemblies having capacitive units, and having resistive structures coupled with the capacitive units.

BACKGROUND

Integrated assemblies may utilize circuits comprising resistors and capacitors (RC circuits) to stabilize power throughout the assemblies. For instance, the RC circuits may be provided peripherally to a memory array (e.g., a DRAM array), and may be utilized to modify the rise speed of power supply voltages, alleviate oscillation of the voltages, and otherwise smooth the voltages. The capacitors utilized within the RC circuits may be analogous to those utilized in the memory array. For instance, if the memory array utilizes container-type (cylinder-shaped) capacitors, then the RC circuits may utilize analogous capacitor configurations in order to simplify fabrication of the RC circuits.

The capacitive units of the RC circuits may comprise multiple capacitive subunits electrically coupled with one another. Such capacitive subunits may be arranged in capacitive arrays.

The resistors of the RC circuits may be comprised by elements having multiple resistive units provided in series. Contact regions may be provided between the resistive units, and the overall resistance of a resistive unit may be determined through the particular contact region(s) utilized for establishing electrical contact to the resistive unit. An example prior art RC assembly 200 is described with reference to FIGS. 1 and 2.

Referring to FIG. 1, the assembly 200 comprises a resistive unit (structure) 202 which includes five resistive regions R1-R5, and five contact regions (CON1-CON5) interspersed with the resistive regions. Any suitable number of resistive regions and contact regions may be provided; and in some example applications there may be 28 resistive regions and 28 contact regions.

The illustrated resistive unit 202 has the resistive regions R1-R5 narrower than the contact regions CON1-CON5 so that the resistive regions have higher resistance than the contact regions. The interfaces between the contact regions and the resistive regions are shown to have relatively sharp corners. In practice, it is difficult to fabricate a structure having the illustrated sharp corners, and instead the structure will have rounded corners indicated by the dashed lines 203. The rounded corners may vary due to processing limitations. Such variation of the rounded corners may problematically create undesired performance differences along the differing contact region/resistive region interfaces of an individual resistive structure 202, and/or may lead to non-uniformity of performance across multiple resistive structures intended to be substantially identical to one another.

The assembly 200 comprises a capacitive unit 204 which includes multiple capacitive subunits 206 arranged in a capacitive array. The capacitive subunits 206 may be simple capacitors, such as, for example, container-shaped capacitors, planar capacitors, etc. The capacitive subunits 206 are electrically coupled with one another to form the capacitive unit 204. In the illustrated configuration, the capacitive subunits are arranged within two groups which are identified in FIG. 1 as Group 1 and Group 2. The capacitive subunits within Group 1 may be referred to as a first group of capacitive subunits, and the capacitive subunits within Group 2 may be referred to as a second group of capacitive subunits. The first group of capacitive subunits is electrically coupled with a $V_{CAP}$ terminal, and the second group of capacitive subunits is electrically coupled with a supply voltage $V_{SS}$ terminal. FIG. 1C schematically illustrates a region of the capacitive unit 204 and shows the first and second groups (Group 1 and Group 2) of the capacitive subunits 206 coupled with the $V_{CAP}$ and $V_{SS}$ terminals, respectively. A common plate 208 (shown in FIG. 1C) extends across all of the capacitive units 206 within Groups 1 and 2.

An input voltage $V_{IN}$ is coupled with one end of the resistive unit 202, and the capacitive unit 204 is coupled with an opposing end of the resistive unit. In operation, the input voltage passes through the resistive regions R1-R5, in series, to the capacitive unit 204. FIG. 1A schematically illustrates the RC assembly 200 of FIG. 1; and shows the input voltage $V_{IN}$ electrically coupled with the capacitive unit 204 through the first contact region CON1 and through the resistive regions R1-R5 in series.

FIG. 1B shows a cross-section along the line B-B of FIG. 1. The resistive unit 202 is part of a first metal level M0. Voltage sources providing the voltages $V_{IN}$ and $V_{SS}$ are coupled with conductive structures 210 and 214, respectively; and the $V_{CAP}$ terminal is diagrammatically illustrated as 212. The conductive structures 210, 212 and 214 are along a second metal level M1. The terms "first metal level" and "second metal level" are arbitrary, and are simply used to distinguish the levels M0 and M1 from one another. In some applications, the level M0 may be referred to as the second metal level, and the level M1 may be referred to as the first metal level.

The resistive unit 202 extends to a conductive structure 216 coupled with the first group of capacitive subunits 206. Another conductive structure 218 is coupled with the second group of capacitive subunits 206. The structures 216 and 218 are along the first metal level M0, and are spaced from one another.

The conductive structure 210 is electrically coupled with the contact region CON1 through a set of conductive contacts 220. Similarly, the conductive structure 212 is coupled with the conductive structure 216 through a set of the conductive contacts 220, and the conductive structure 214 is coupled with the conductive structure 218 through a set of the conductive contacts 220. The conductive contacts 220 are diagrammatically illustrated in the top-down view of FIG. 1 with a series of dots.

In practice, the schematic diagram of FIG. 1A is too simple in that such diagram ignores resistive contributions from the contacts 220 and the contact regions (e.g., CON1). FIG. 1D shows a schematic diagram which more accurately represents the integrated assembly 200. Specifically, FIG. 1D shows resistive contributions from the contact regions CON1-CON5, and shows resistive contributions from the contacts 220. In operation, all of such resistive contacts should be considered in designing the resistive unit 202. The contributions of the contact regions CON1-CON5 are in series with the resistive regions R1-R5, and may provide substantial parasitic resistance requiring significant adjustment in order to fabricate the resistive unit 202 to operate within desired tolerances. Further, the difficulty described above with reference to FIG. 1 regarding the curved corners illustrated with the dashed line 203 may cause non-uniformity across resistive units intended to operate substantially identically to one another, which may further complicate fabrication of the resistive units.

FIG. 2 shows the RC assembly 200 in an operational mode different from that of FIG. 1. The conductive structure 210 (FIG. 1B) extends across all of the contact regions CON1-CON5 and is coupled with such contact regions. Accordingly, the resistive unit 202 of FIG. 2 is in a lower voltage operational mode relative to the operational mode shown in FIG. 1. FIG. 2A schematically illustrates the assembly of FIG. 2 in a manner analogous to that of FIG. 1D, and FIG. 2B shows a cross-sectional view of the assembly of FIG. 2 along the line B-B of FIG. 2. The operational mode of FIGS. 2-2B almost enables the resistive contributions of the contact regions (CON1-CON5) to be bypassed, as shown in FIG. 2A. However, even in the operational mode of FIGS. 2-2B the resistive contributions of the contact regions CON1-CON5 are not entirely omitted, and remain problematic relative to the design of an operational RC assembly performing within desired tolerances.

It would be desirable to develop new RC assemblies which overcome the shortcomings of the prior art assemblies described above.

DETAILED DESCRIPTION OF THE ILLUSTRATED EMBODIMENTS

In some embodiments, an integrated assembly includes an RC assembly having a resistive structure which passes under a capacitive unit, which has a wide-end-region coupled with the capacitive unit and a $V_{CAP}$ terminal. The resistive structure has narrow resistive features (which may be referred to as wiring, lines, tines, fingers, etc.) extending from the wide-end-region to second-end-regions. One or more of the second-end-regions may be coupled with an input terminal receiving an input voltage $V_{IN}$. The resistive features provide resistive contributions to the resistive structure, with such resistive contributions being in parallel with one another. Example embodiments are described with reference to FIGS. 3-7.

Figure 3:
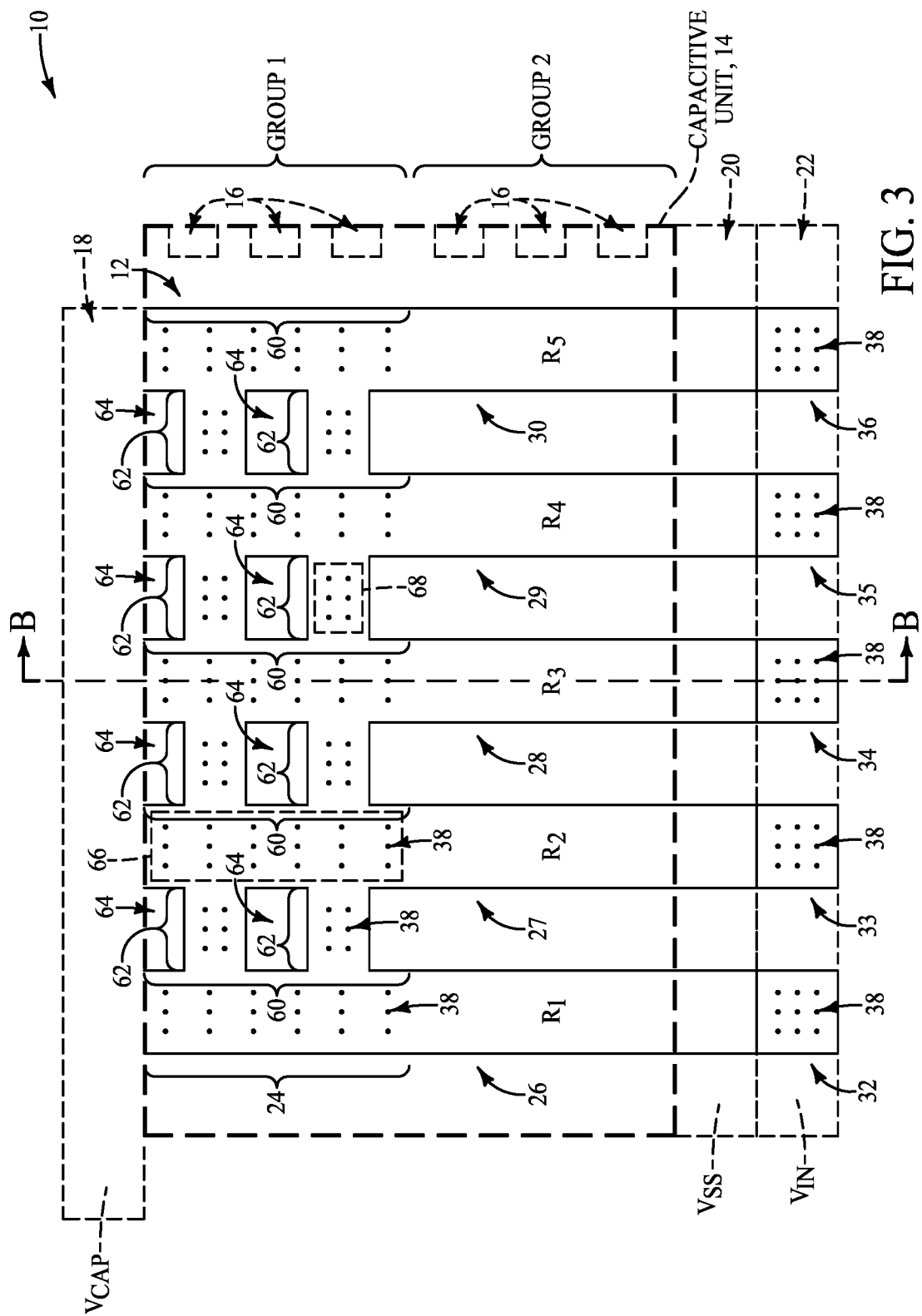
FIG. 3 is a diagrammatic top-down view of a region of an example integrated assembly.

Referring to FIG. 3, an integrated assembly 10 includes a resistive structure 12 under a capacitive unit 14.

Figures 1, 1C:
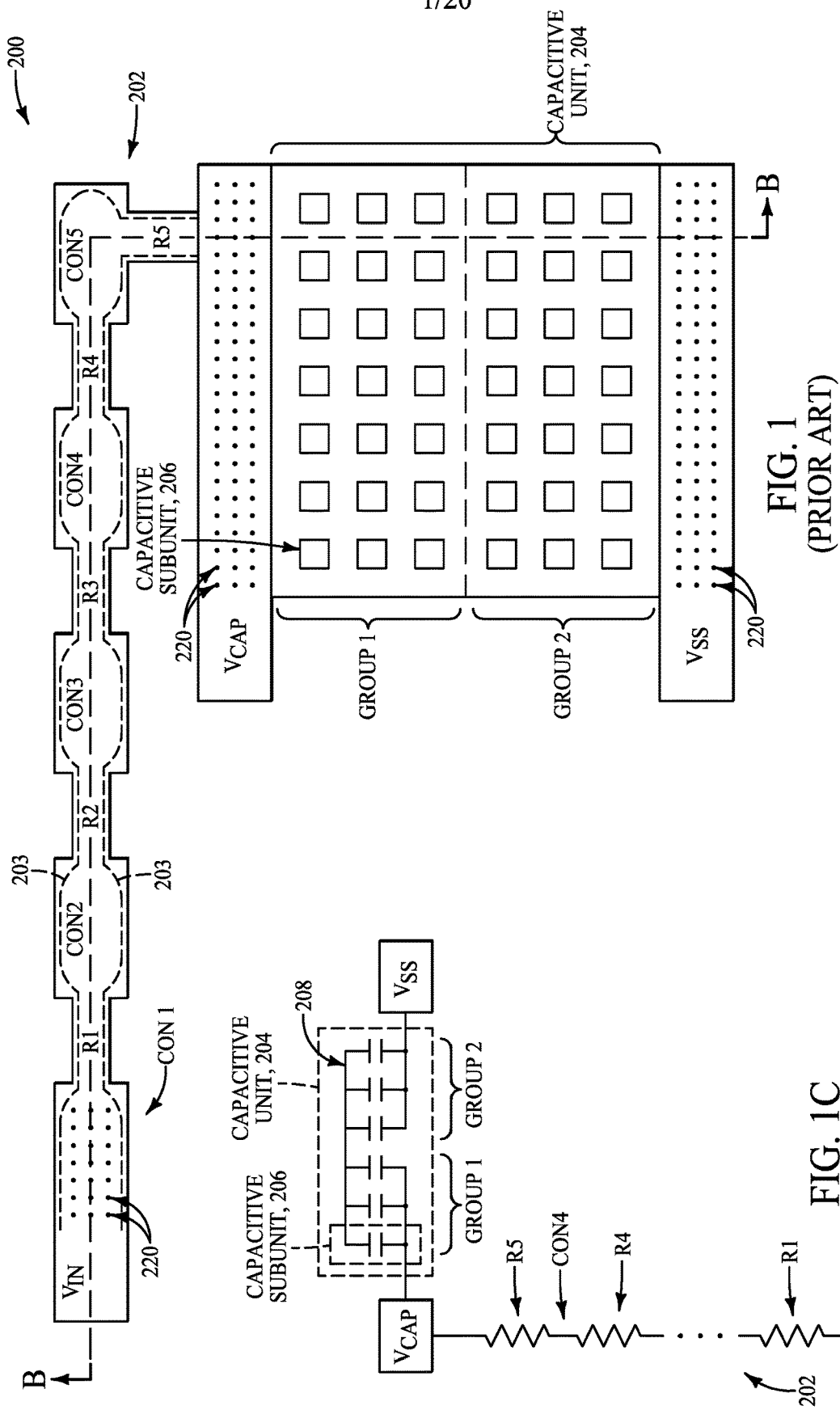
FIG. 1 is a diagrammatic top-down view of a region of a prior art integrated assembly.
FIG. 1C is another diagrammatic schematic view of the prior art assembly of FIG. 1.
Figure 1A:
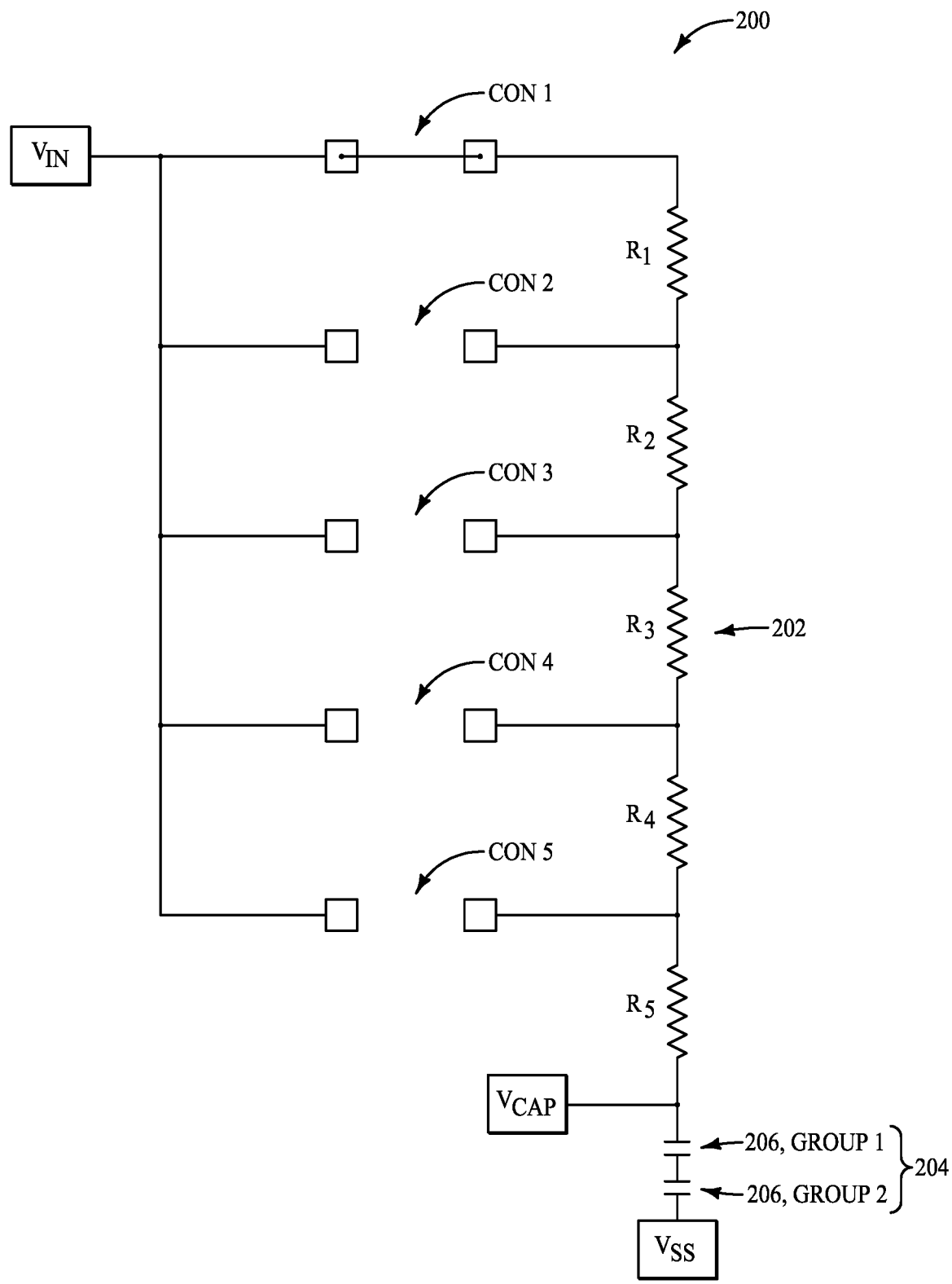
FIG. 1A is a diagrammatic schematic view of the prior art assembly of FIG. 1.

The capacitive unit 14 may comprise a same configuration as the prior art capacitive unit 204 of FIG. 1. The capacitive unit 14 is illustrated in dashed-line (phantom) view in FIG. 3 so that the underlying resistive structure 12 may be clearly illustrated. The capacitive unit 14 comprises capacitive subunits 16 (only some of which are illustrated). The capacitive subunits 16 may be identical to the capacitive subunits 206 described above relative to FIG. 1, and in some embodiments may be analogous to capacitors utilized in a memory array proximate the capacitive unit 14. The capacitive subunits are subdivided amongst the first and second groups (Group 1 and Group 2) as described above with reference to prior art FIG. 1. The capacitors utilized within the RC circuits of the integrated assembly 10 may be analogous to those utilized in the memory array. For instance, if the memory array utilizes container-type (cylinder-shaped) capacitors, then the RC circuits may utilize analogous capacitor configurations in order to simplify fabrication of the RC circuits.

The assembly 10 of FIG. 3 also comprises conductive interconnects 18, 20 and 22. The interconnect 20 may be coupled with a first voltage source configured to supply a reference voltage, such as $V_{SS}$. The interconnect 22 may be coupled with a second voltage source configured to supply a power voltage $V_{IN}$, such as Vdd or the like. The $V_{SS}$ and Vdd voltages are used as power voltages on which a memory circuit (not shown) of the assembly 10 operates. The interconnect 18 is a $V_{CAP}$ terminal.

The resistive structure 12 may be alternatively referred to as a resistive unit, resistive element, etc. The resistive structure 12 comprises a first-end-region 24 (also referred to as a wide-end-region); and comprises a plurality of resistive lines 26-30 extending outwardly from the first-end-region 24. The lines 26-30 may be alternatively referred to as fingers, tines, wiring, features, structures, etc. The resistive lines 26-30 comprise resistive regions $R_1$-$R_5$ analogous to those described above with reference to prior art FIG. 1. However, in contrast to the series arrangement of the resistive regions $R_1$-$R_5$ of the configuration of FIG. 1, the resistive regions $R_1$-$R_5$ of the configuration of FIG. 3 are arranged in parallel relative to one another. The example resistive structure 12 of FIG. 3 is shown having 5 resistive lines (26-30), and 5 associated resistive regions ($R_1$-$R_5$). The illustrated resistive lines 26-30 are all about a same cross-sectional area as one another and all about a same length as one another, so that the resistive lines 26-30 all represent about a same resistance value as one another. It is to be understood that the resistive structure may have any suitable number of lines and associated resistive units; and in other example embodiments may have more than the illustrated 5 lines, or fewer than the illustrated 5 lines.

Figure 1B:
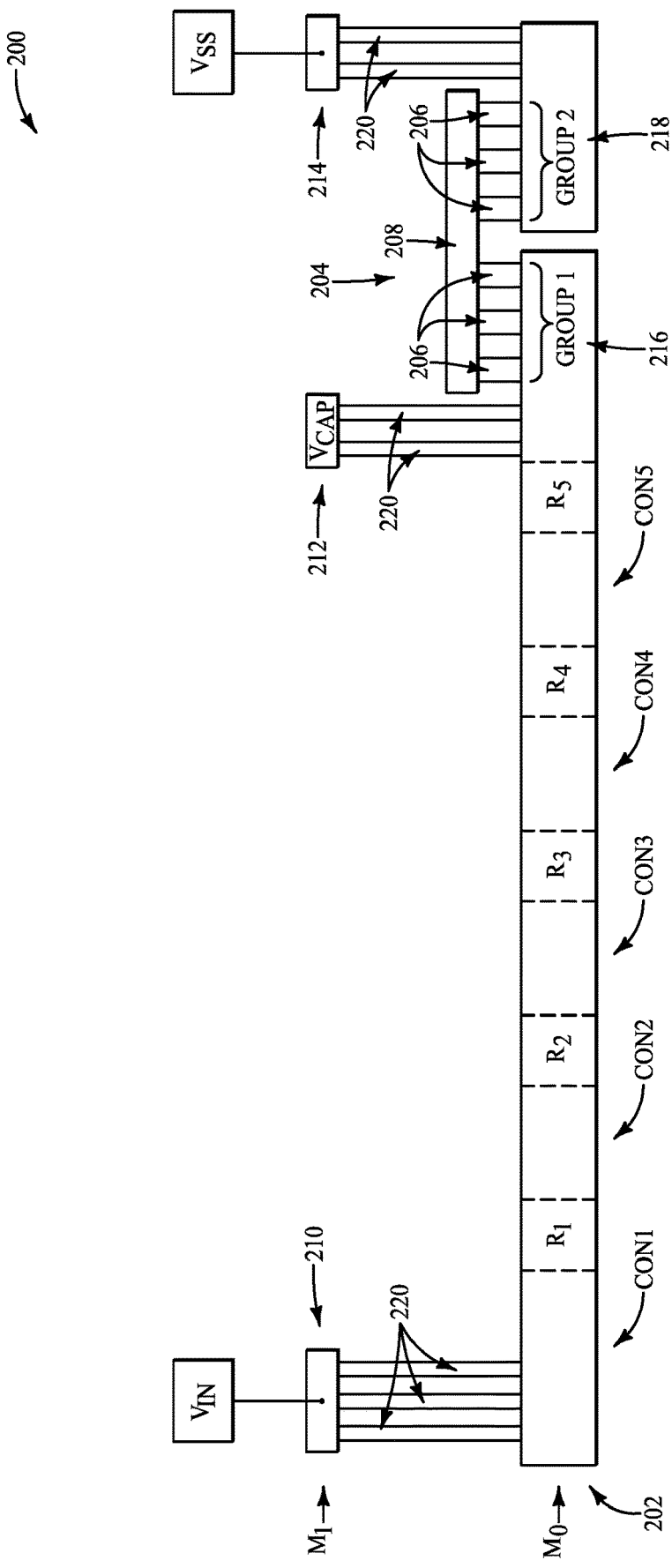
FIG. 1B is a diagrammatic cross-sectional side view of the prior art assembly of FIG. 1 along the line B-B of FIG. 1.
Figure 1D:
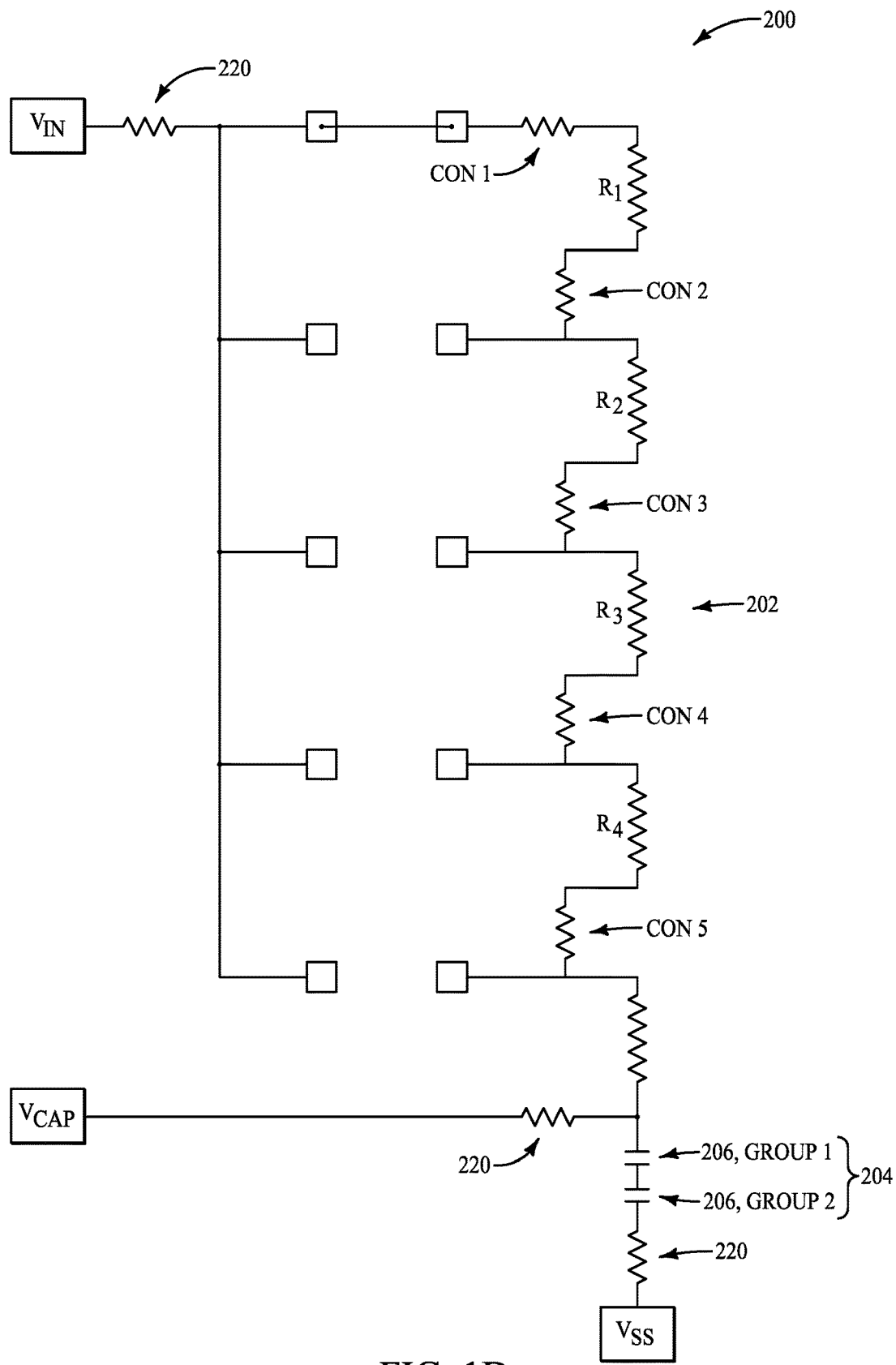
FIG. 1D is another diagrammatic schematic view of the prior art assembly of FIG. 1.

The lines 26-30 extend to second-end-regions 32-36, respectively. The second-end-regions 32-36 are coupled with the $V_{IN}$ interconnect 22 through conductive contacts (interconnects) 38. The conductive contacts 38 may be identical to the conductive contacts 220 described above relative to prior art FIGS. 1 and 1B.

Figure 3A:
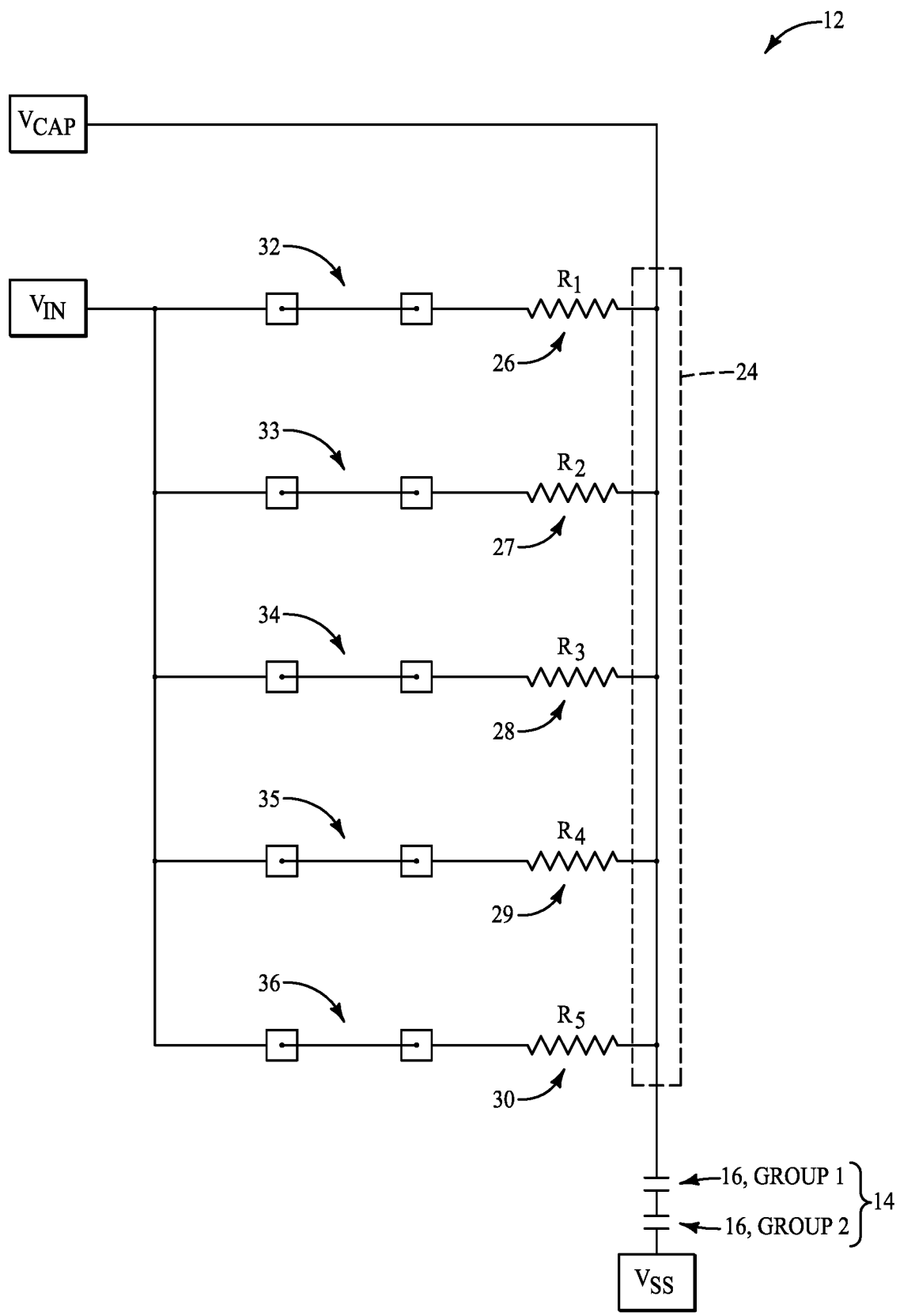
FIG. 3A is a diagrammatic schematic view of the assembly of FIG. 3.

Referring to FIG. 3A, the resistive structure 12 is described with a schematic diagram. The wide-end-region 24 of the resistive structure is coupled with the $V_{CAP}$ interconnect (or terminal), and is also coupled with each of the resistive lines 26-30.

The resistive structure 12 is coupled with capacitive subunits 16 of the first group (Group 1) of the capacitive unit 14, and the capacitive units 16 of the second group (Group 2) are coupled with the $V_{SS}$ interconnect (or terminal).

The resistive lines 26-30 comprise the resistive units $R_1$-$R_5$, respectively; and are arranged in parallel with one another. The resistive lines extend to the second-end-regions 32-36, which comprise couplers configured to couple the lines 26-30 with the $V_{IN}$ interconnect (or terminal). In the embodiment of FIGS. 3 and 3A, all of the resistive lines 26-30 are coupled with the $V_{IN}$ interconnect through the couplers corresponding to the second regions 32-36. In other embodiments, one or more of the couplers may correspond to open circuits, rather than the illustrated closed circuits, and accordingly one or more of the resistive lines 26-30 may be left uncoupled from the $V_{IN}$ interconnect (an example embodiment is described below with reference to FIGS. 4-4B).

Figure 3B:
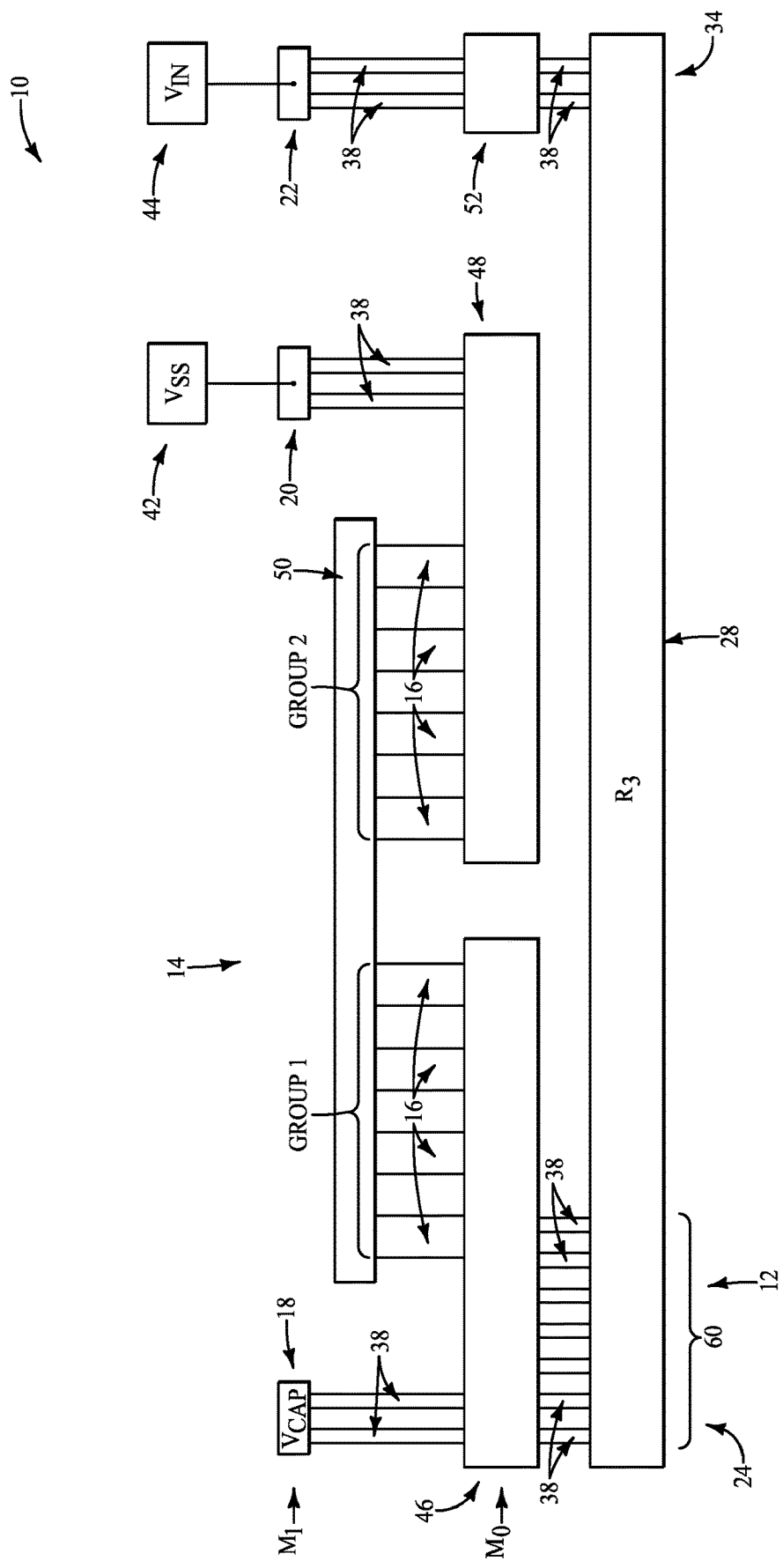
FIG. 3B is a diagrammatic cross-sectional side view of the assembly of FIG. 3 along the line B-B of FIG. 3.

Referring to FIG. 3B, a region of the assembly 10 of FIG. 3 is shown along a cross-section corresponding to the line B-B of FIG. 3. The region of FIG. 3B includes the resistive line 28 of the resistive structure 12, and the associated resistive unit $R_3$.

The cross-sectional view of FIG. 3B shows the conductive interconnects 18, 20 and 22 along a metal level (conductive level) indicated as M1. The interconnect 18 serves as a $V_{CAP}$ terminal, the interconnect 20 is connected to a first voltage source 42 which provides $V_{SS}$ voltage, and the third interconnect 22 is connected to a second voltage source 44 which provides input voltage $V_{IN}$.

A first conductive structure 46 is under the first group (Group 1) of the capacitive subunits 16, and a second conductive structure 48 is under the second group (Group 2) of the capacitive subunits 16. The first and second conductive structures 46 and 48 are electrically coupled with the first and second groups of the capacitive subunits 16. The conductive structures 46 and 48 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive structures 46 and 48 are shown to be at a second metal level (conductive level) indicated as M0, and shown to be below the first metal level M1. The conductive structures 46 and 48 are spaced from one another along the conductive level M0. The conductive structures 46 and 48 may have any suitable configurations; and in some embodiments may be referred to as plates (or as conductive plates).

A common plate 50 extends across all of the capacitive subunits 16 of the first and second groups (Group 1 and Group 2) to couple the first and second groups (Group 1 and Group 2) in series to each other. In some embodiments, the common plate 50 may be referred to as a third conductive structure distinguish it from the first and second conductive structures 46 and 48. The common plate 50 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, conductively-doped silicon and germanium alloy, etc.).

The conductive interconnect 18 is coupled with the first conductive structure 46 through the conductive contacts 38. Similarly, the conductive interconnect 20 is coupled with the second conductive structure 48 through conductive contacts 38, and accordingly the second conductive structure 48 is coupled with the voltage $V_{SS}$.

The resistive structure 12 has the first-end-region 24 and the second-end-region 34. The first-end-region 24 is under the first conductive structure 46 and is coupled with the first conductive structure 46 through a plurality of the conductive contacts 38 (such contacts are also represented in FIG. 3 as contacts 38 associated with the wide region 24 of the resistive structure 12).

Referring still to FIG. 3B, the third interconnect 22 is coupled to a conductive structure 52 through conductive contacts 38. The conductive structure 52 is at the conductive level M0 and is spaced from the second conductive structure 48. The conductive structure 52 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The second-end-region 34 of the resistive structure 12 is coupled with the conductive structure 52 through conductive contacts 38, and accordingly is coupled with the input voltage $V_{IN}$.

In some embodiments, the conductive contacts 38 coupled to the second-end-region 34 of the resistive structure 12 may be referred to as second conductive contacts, and the conductive contacts 38 coupled to the first-end-region 24 of the resistive structure 12 may be referred to as first conductive contacts, so that the conductive contacts associated with the second-end-region of the resistive structure 12 may be distinguished from those associated with the first-end-region of the resistive structure.

The conductive contacts 38 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The resistive structure 12 may comprise any suitable composition(s); and in some embodiments may comprise polycrystalline silicon. The resistive structure may be formed simultaneously with gate electrodes of transistors, and the gate electrodes may comprise a stacked structure including polycrystalline silicon and metal(s). In any event, the polycrystalline silicon may be doped with impurities representing p-type or n-type; and in some embodiments may have a sheet resistance of from about 5 to about 10 ohms/square (ohms per □). The entirety of the resistive structure 12 may comprise a single composition, or the resistive structure 12 may comprise multiple discrete materials.

Figure 3C:
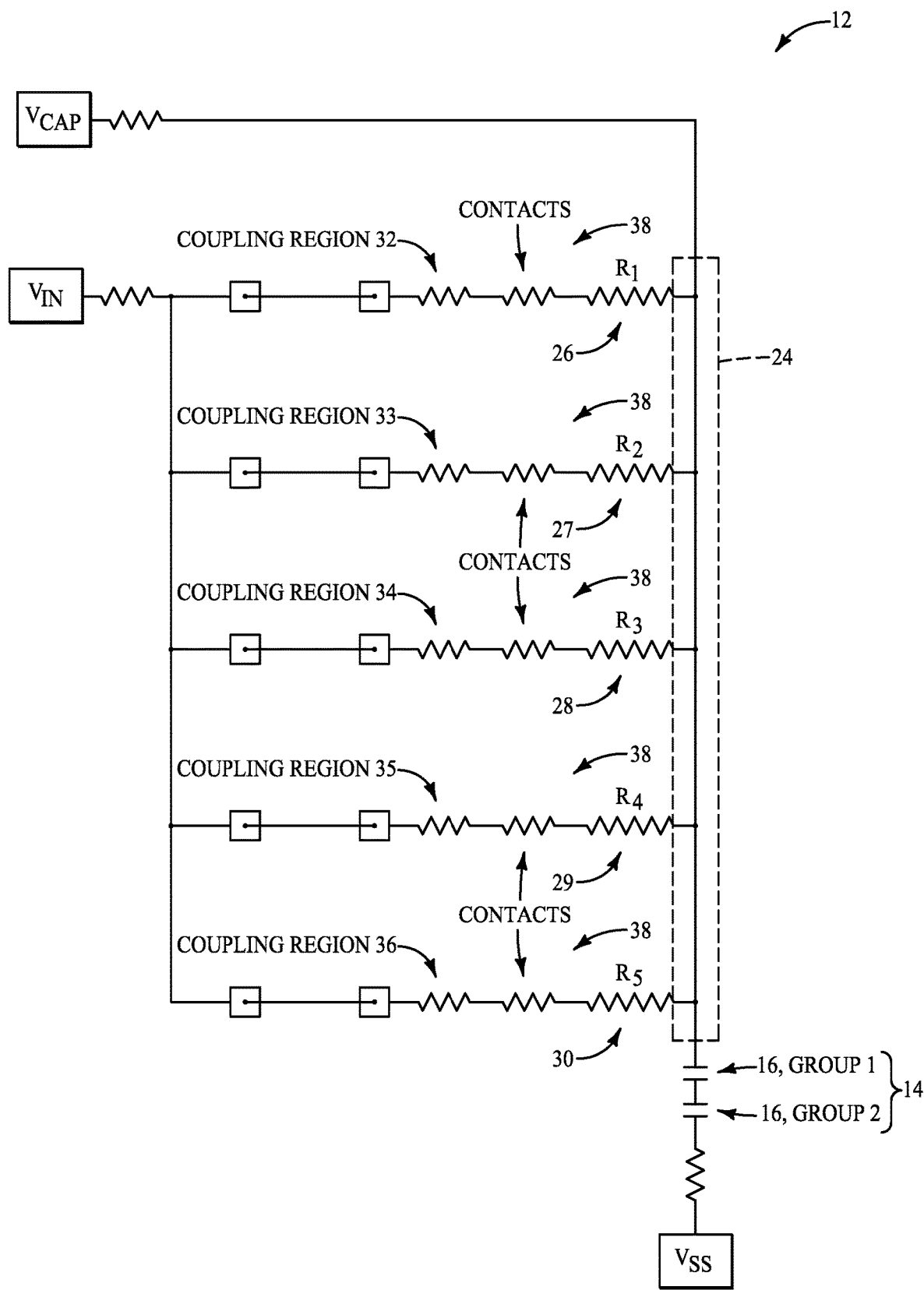
FIG. 3C is another diagrammatic schematic view of the assembly of FIG. 3.

In some applications, the schematic diagram of FIG. 3A may be overly simplistic. FIG. 3C is a schematic diagram analogous to that of FIG. 3A, but also showing resistive contributions from various contacts 38 and from the coupling regions 32-36.

Figure 3D:
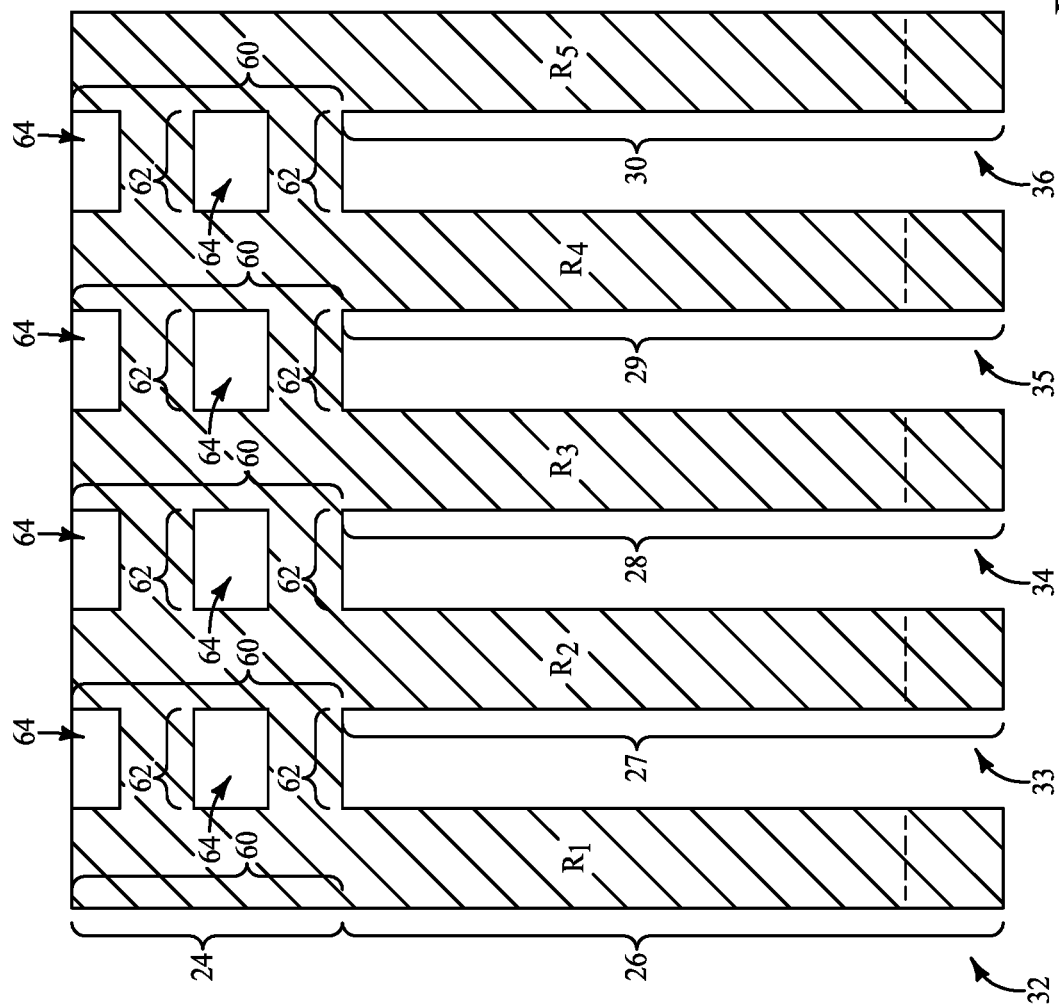
FIG. 3D is a top-down view of a resistive structure of the example integrated assembly of FIG. 3.

Referring to FIG. 3D, the resistive structure 12 is shown in isolation to assist the reader in understanding the example configuration of the resistive structure. Crosshatching is shown along the material of the resistive structure to assist the reader in visualizing the resistive structure.

The resistive structure 12 comprises the first-end-region (wide-end-region) 24, and the lines (wirings, fingers, tines, etc.) 26-30 extending laterally outwardly from the wide-end-region 24. Each of the lines 26-30 terminates at one of the second-end-regions 32-36.

In some embodiments, the first-end-region 24 may be considered to comprise a lattice of first features 60 and second features 62. The first features 60 extend along an illustrated y-axis direction (i.e., a first direction), and extend from the resistive lines 26-30. The second features 62 extend between the first features 60, and extend along an illustrated x-axis direction (i.e., a second direction). The second direction of the second features 62 crosses the first direction of the first features 60, and in the shown embodiment is substantially orthogonal to the first direction of the first features 60. The illustrated lattice has openings 64 extending therethrough. The illustrated openings 64 are square-shaped. In other embodiments, the openings 64 may have other suitable shapes, including, for example, rectangular, circular, elliptical, etc.

The conductive contacts 38 which couple the first group (Group 1) of capacitive subunits 16 to the first-end-region 24 of the resistive structure 12 (shown in FIG. 3B as coupling the first-end-region 24 to the conductive structure 46 which in turn is coupled with the capacitive subunits 16 of the first group (Group 1)) may be coupled with either or both of the first features 60 and the second features 62 of the first-end-region 24. For instance, FIG. 3 shows an embodiment in which the conductive contacts 38 are coupled with both the first features 60 and the second features 62. In some embodiments, the conductive contacts 38 coupled with the first-end-region 24 may be considered to be subdivided amongst sets. First sets of the contacts 38 may be considered to correspond to the contacts 38 coupled with the first features 60 of the first-end-region 24, and second sets of the contacts 38 may be considered to be the contacts which are coupled with the second features 62 of the first-end-region 24. FIG. 3 diagrammatically indicates one of the first sets of the contacts 38 as being the contacts enveloped by a dashed-line region 66, and diagrammatically illustrates one of the second sets of the contacts 38 as being the contacts enveloped by a dashed-line region 68. The contacts 38 coupled with a feature 60 may be considered to be associated with such feature, and similarly the contacts 38 coupled with a feature 62 may be considered to be associated with such feature. FIG. 3B shows that some of the contacts 38 may directly couple a feature 60 associated with resistive structure 12 to the conductive plate 46. Similar direct coupling may occur between the features 62 and the plate 46 along other cross-sections analogous to the illustrated cross-section of FIG. 3B.

Figure 3E:
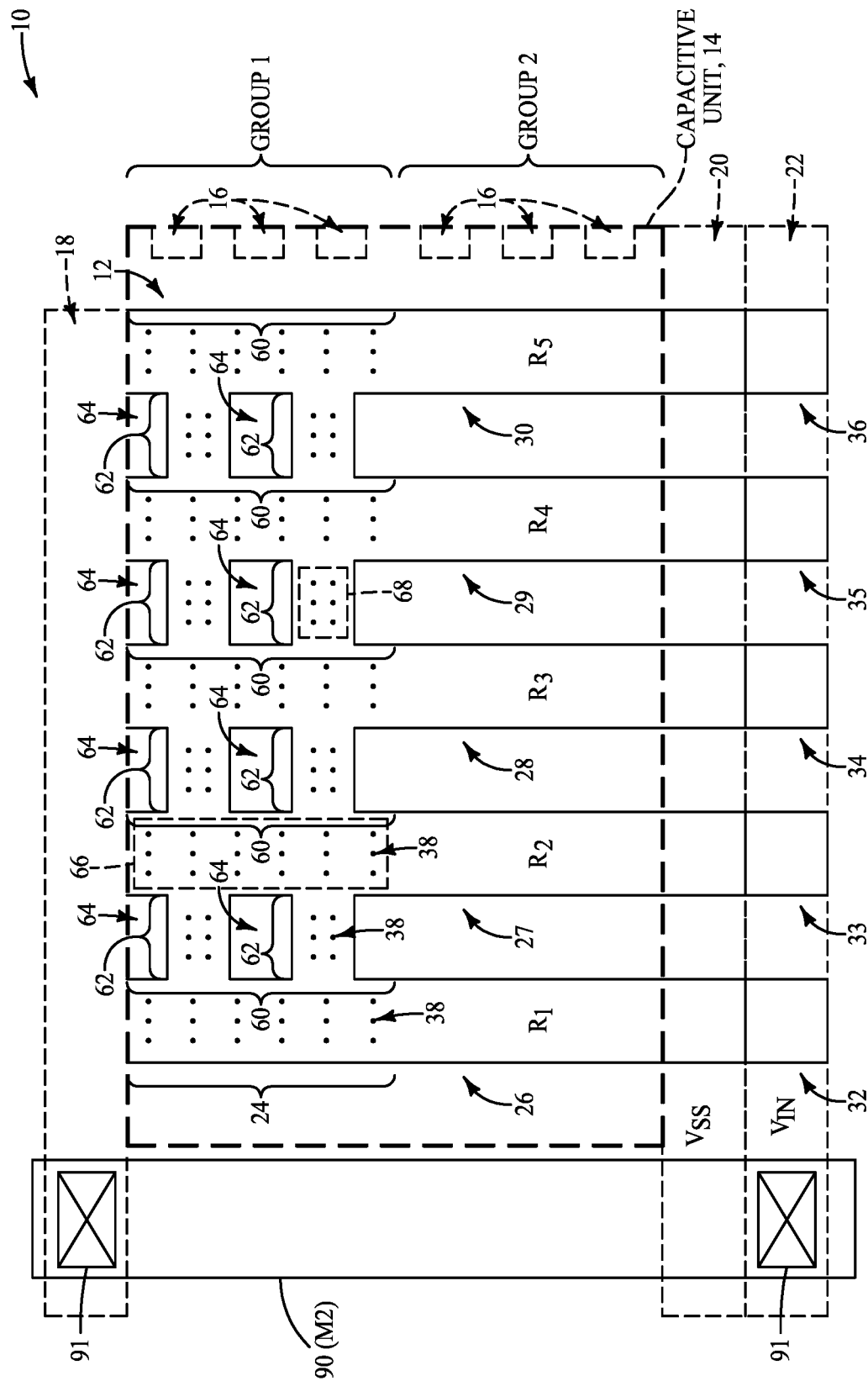
FIG. 3E is a top-down view of the resistive structure of the example integrated assembly of FIG. 3.

It may be that none of the resistive units R1-R5 caused by the resistive lines 26-30 is needed accordingly to the required electrical characteristics of the RC circuit. In such cases, the $V_{CAP}$ interconnect/terminal 18 and the $V_{IN}$ interconnect/terminal 22 may be connected with each other through a conductive line 20, as shown in FIG. 3E. The conductive line 90 is at another conductive level $M_2$ that is upper than the level $M_1$ and contacts respective parts of the $V_{CAP}$ interconnect/terminal 18 and the $V_{IN}$ interconnect/terminal 22 through contact plugs 91.

It should be noted that each of the first and second groups (Group 1 and Group 2) of the capacitive subunits 16 has a relatively low withstanding voltage, and thus the first and second groups are coupled in series between the $V_{CAP}$ interconnect/terminal and the $V_{SS}$ interconnect/terminal. In cases where the capacitive subunit 16 has a sufficiently withstanding voltage, accordingly, one of the first and second groups (Group 1 and Group 2) can be omitted. In contrast, if the capacitive unit 14 is required to have more higher withstanding voltage, the capacitive unit 14 may have three or four groups of capacitive subunits 16. In cases where the capacitive unit 14 has three groups of capacitive subunits 16, the third group (Group 3) of them is constructed to include another common plate, that is provided separately from the common plate 50 (see FIG. 3B) and is coupled with the $V_{SS}$ interconnect/terminal 20, and a plurality of additional capacitive subunits, that are provided between the other common plate and the conductive structure 48. In case where the capacitive unit 14 has four groups of capacitive subunits 16, the third and fourth groups (Group 3 and Group 4) of them are constructed similarly to Group 1 and Group 2 with the conductive structure of the fourth group (Group 4) being coupled with the $V_{SS}$ interconnect/terminal 20. It will be appreciated that the capacitive unit 14 having five or more groups of capacitive subunits may be formed in a similar manner. As for the resistive lines 26-30, on the other hand, the length of each of them is dependent on a required resistance value, so that they are not required to extend under the third and/or fourth groups of capacitive subunits.

Figure 4:
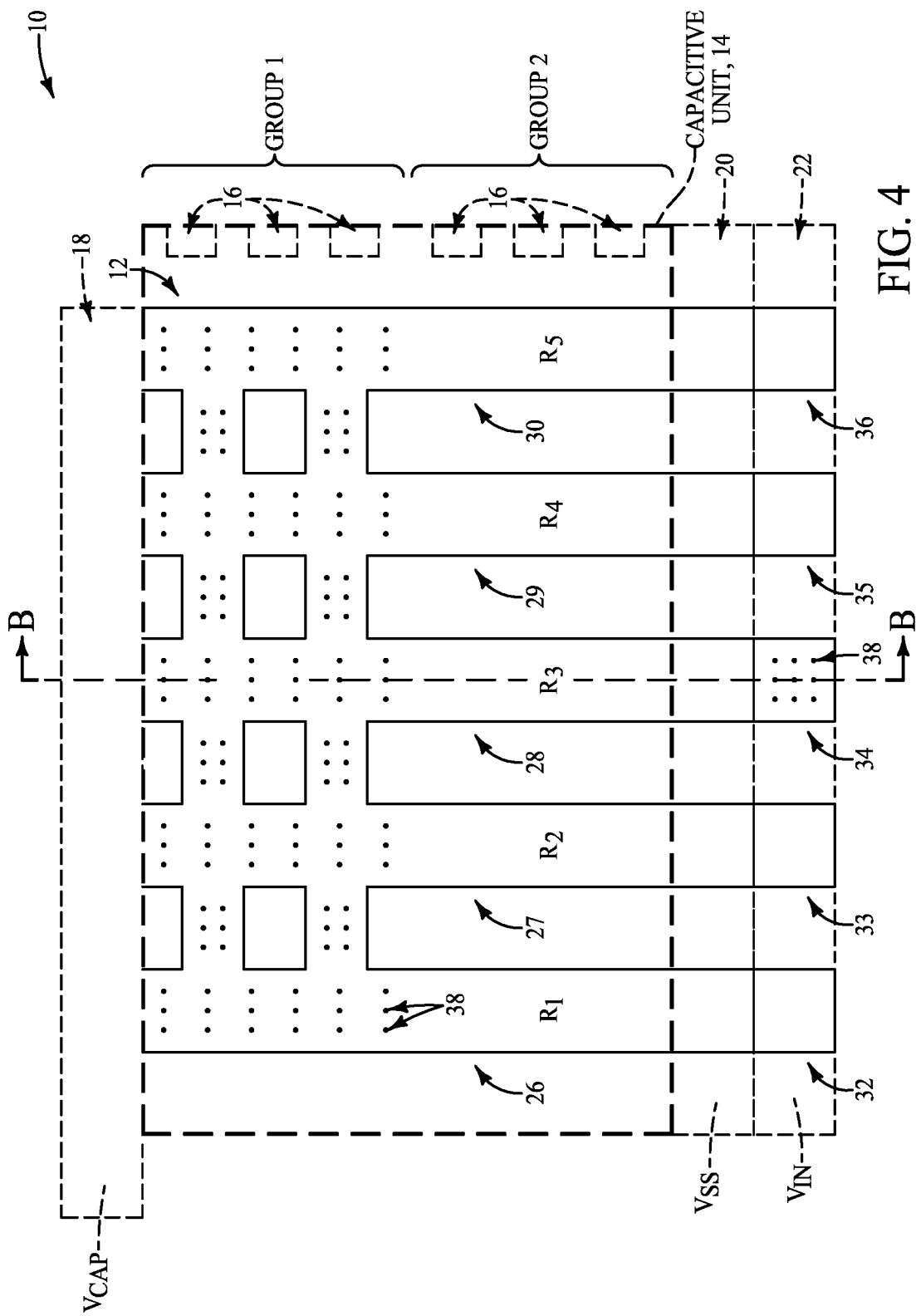
FIG. 4 is a diagrammatic top-down view of the example integrated assembly of FIG. 3, with such integrated assembly being shown at an operational mode different than that of FIG. 3.
Figure 4A:
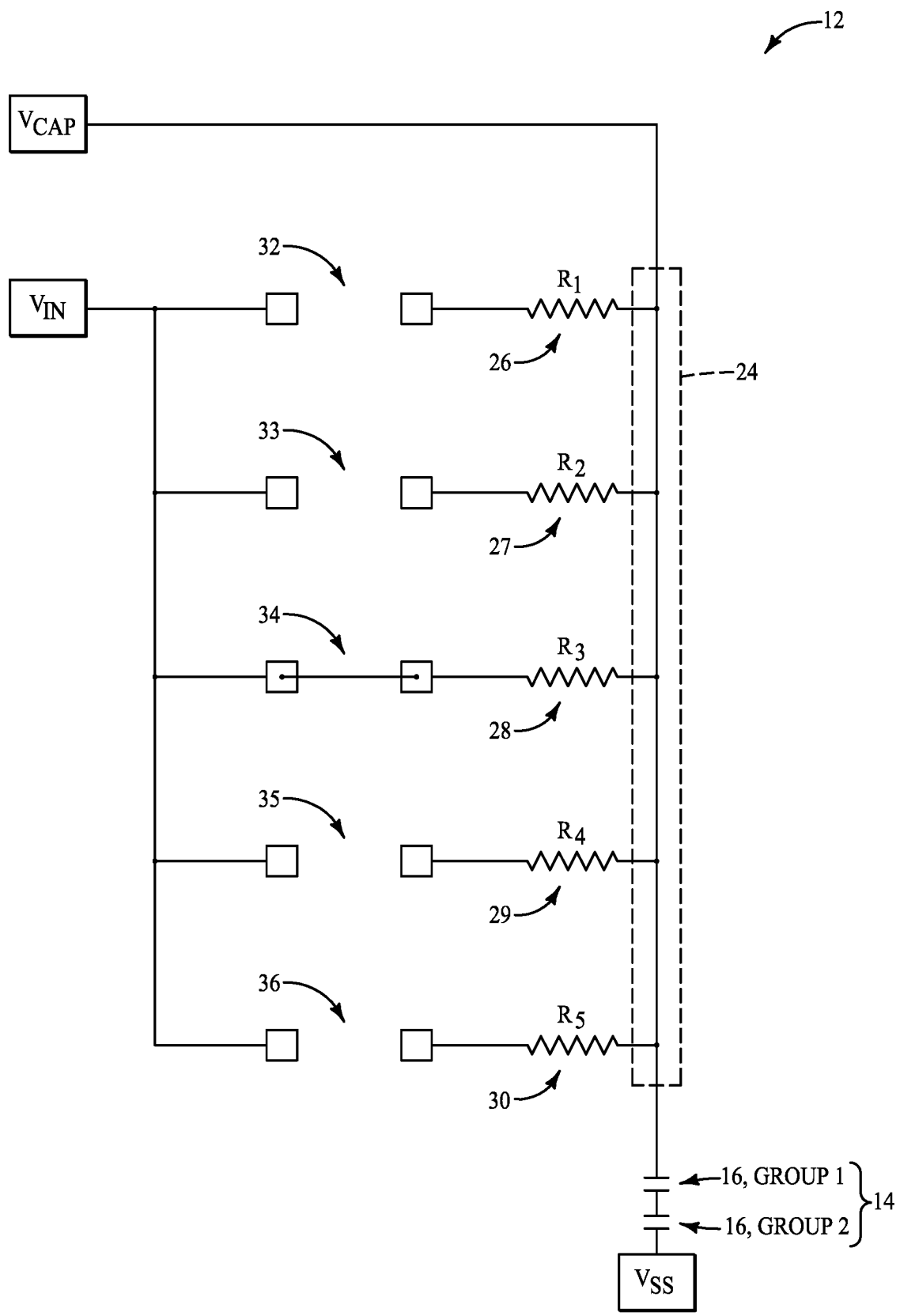
FIG. 4A is a diagrammatic schematic view of the assembly of FIG. 4.
Figure 4B:
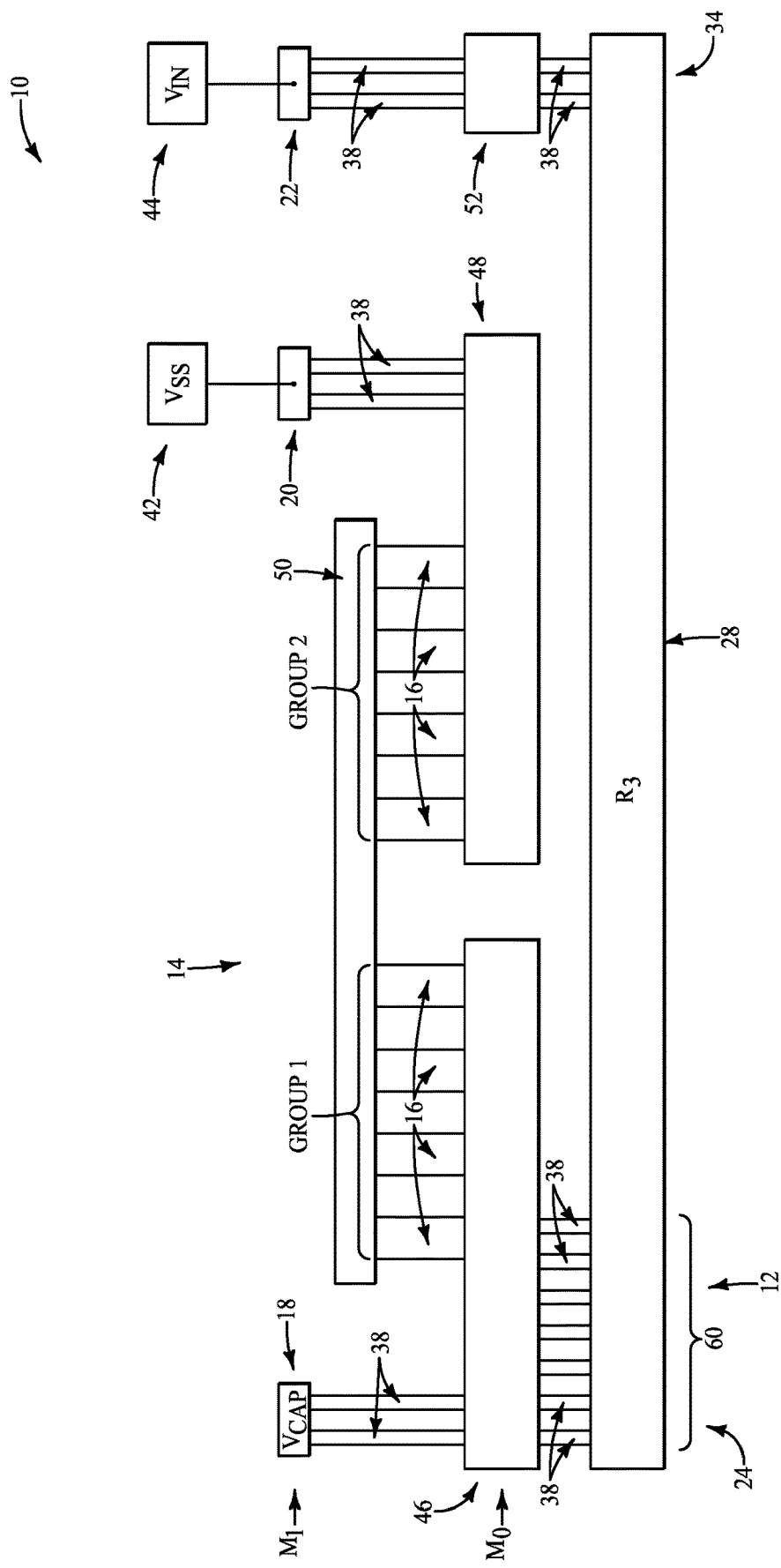
FIG. 4B is a diagrammatic cross-sectional side view of the assembly of FIG. 4 along the line B-B of FIG. 4.

FIGS. 3, 3A and 3B illustrate a mode in which all of the lines 26-30 are coupled with the input voltage $V_{IN}$ (i.e., shows a lowest-resistance mode of the resistive structure 12 of the assembly 10). In other modes, less than all of the lines 26-30 may be coupled with the input voltage in order to achieve a different resistance from the resistive structure 12. FIGS. 4, 4A and 4B show the integrated assembly 10 in a mode alternative that of FIGS. 3, 3A and 3B; and specifically shows that only the central resistive line 28 is coupled with the input voltage $V_{IN}$. The illustrated mode in which only one of the resistive lines 26-30 is coupled with $V_{IN}$ corresponds to an example of a highest-resistance mode of the resistive structure 12 of the assembly 10.

Figure 4C:
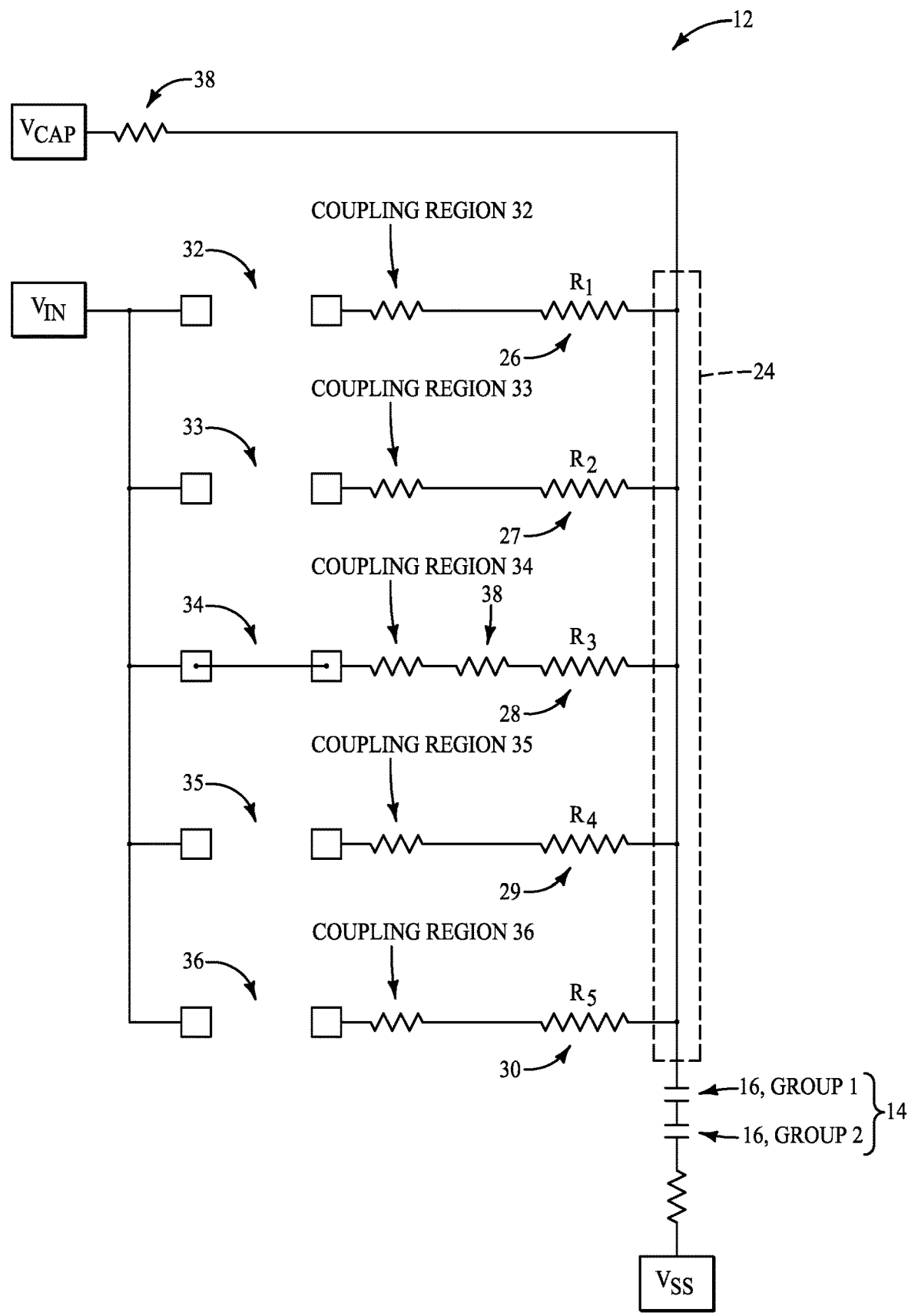
FIG. 4C is another diagrammatic schematic view of the assembly of FIG. 4.

In some applications, the schematic diagram of FIG. 4A may be overly simplistic. FIG. 4C is a schematic diagram of the same operational mode as that of FIG. 4A, but also shows resistive contributions from various contacts 38 and from the coupling regions 32-36.

Figure 2:
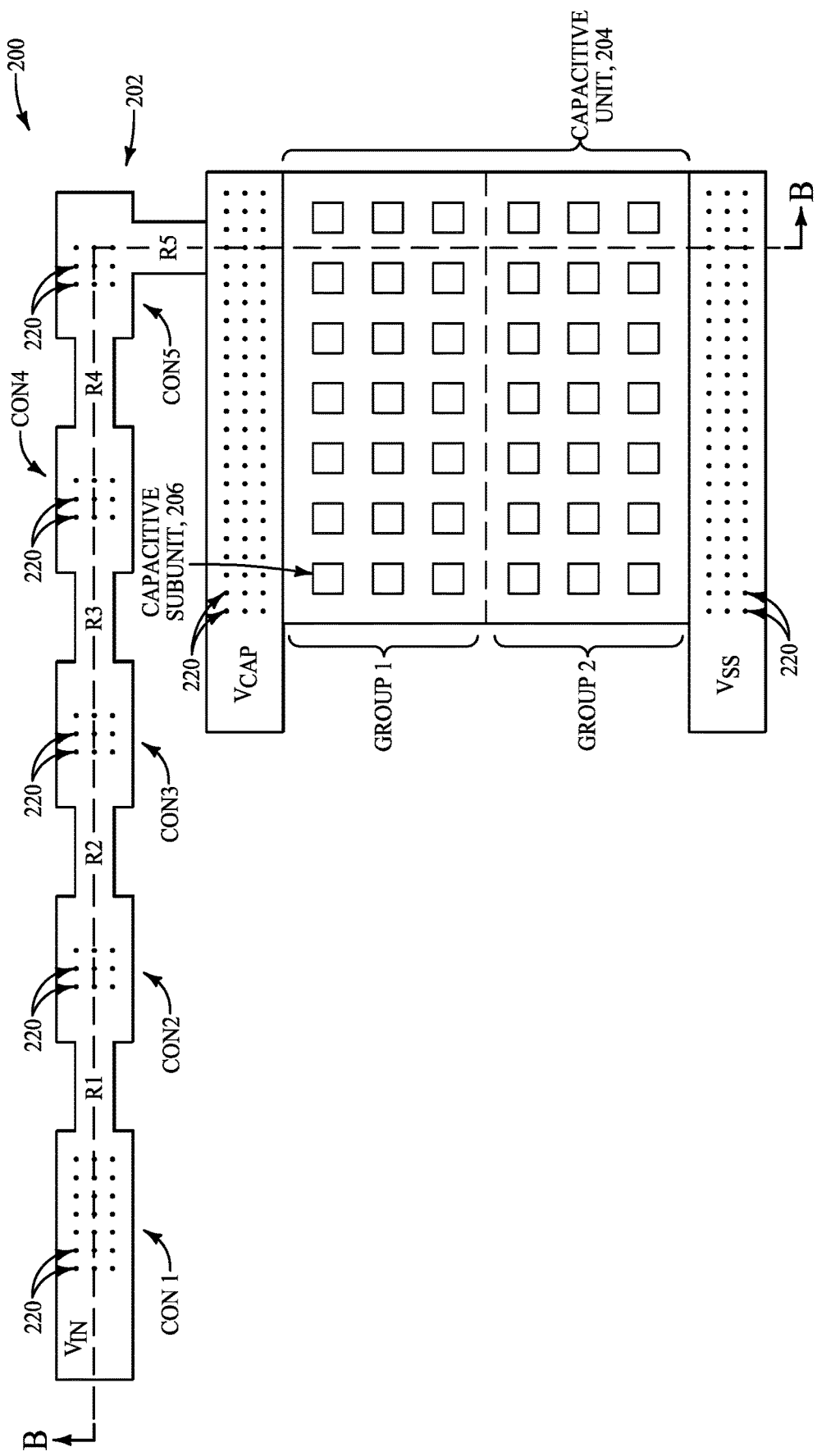
FIG. 2 is a diagrammatic top-down view of the prior art integrated assembly of FIG. 1, with such integrated assembly being shown at an operational mode different than that of FIG. 1.
Figure 2A:
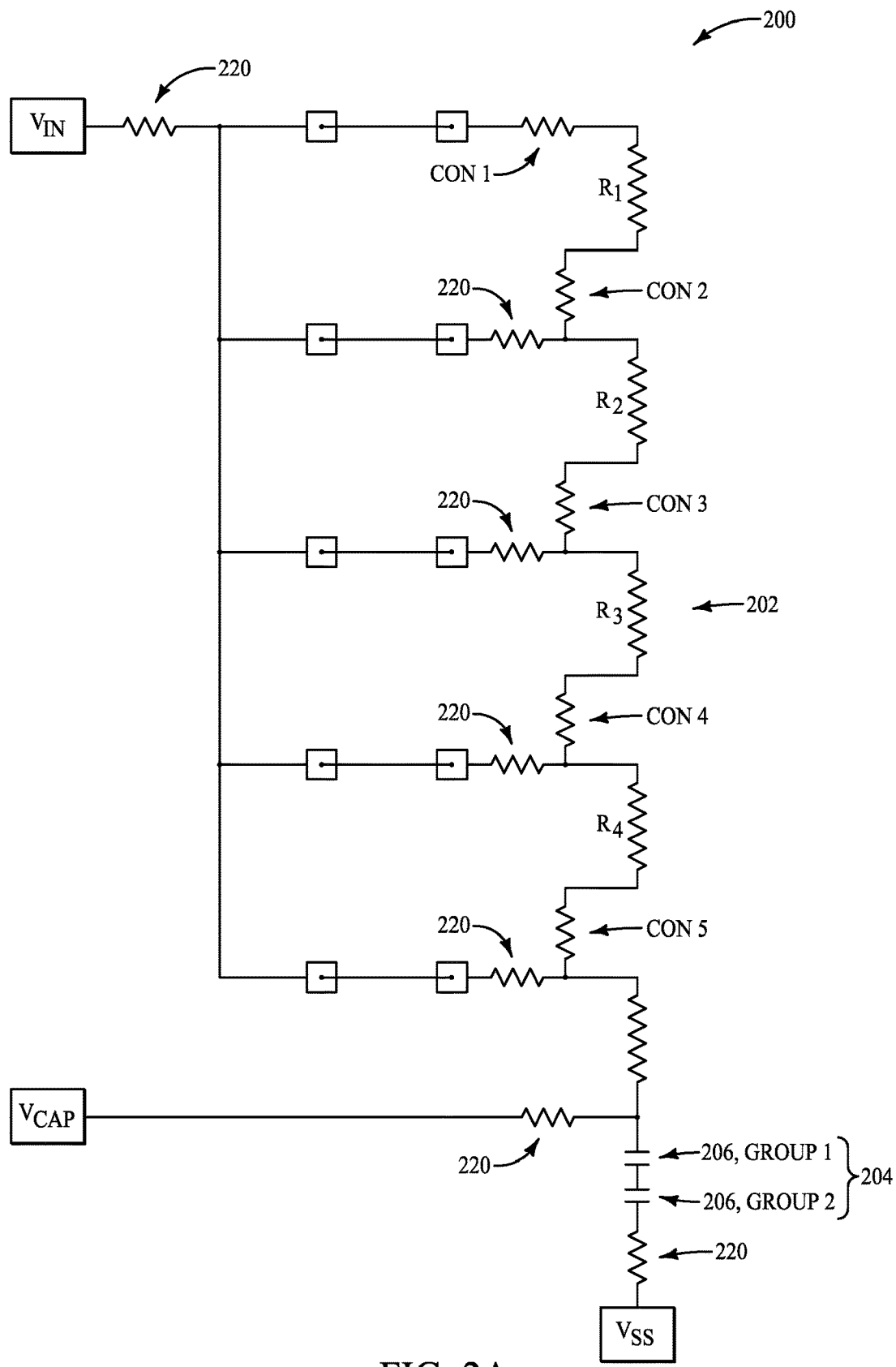
FIG. 2A is a diagrammatic schematic view of the prior art assembly of FIG. 2.
Figure 2B:
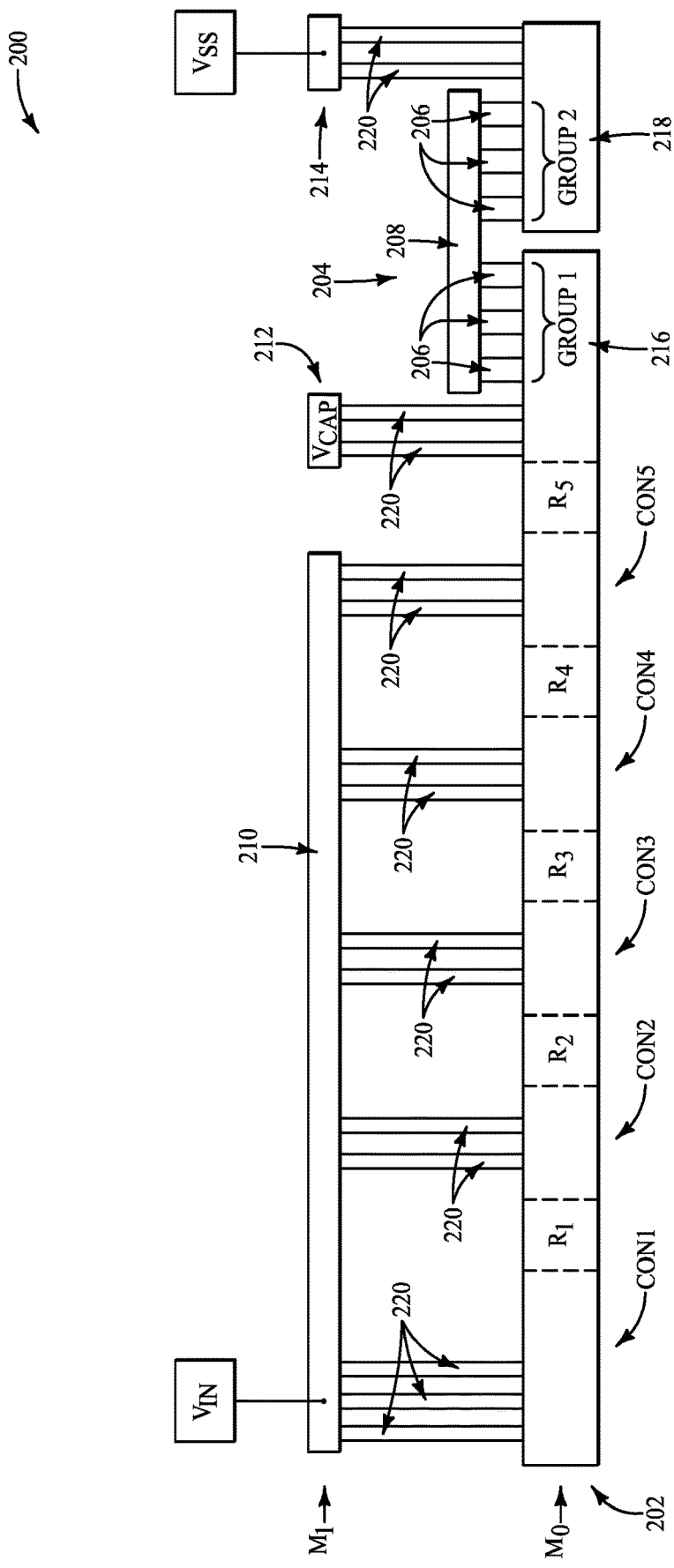
FIG. 2B is a diagrammatic cross-sectional side view of the prior art assembly of FIG. 2 along the line B-B of FIG. 2.

The parallel arrangement of the resistive units $R_1$-$R_5$ of the resistive structures 12 of FIGS. 3 and 4 may enable problems described relative to the prior art structures of FIGS. 1 and 2 to be avoided. Specifically, parasitic resistances contributed by the contact regions 1-5 of the resistive series arrangements of FIGS. 1 and 2 are avoided relative to the parallel resistive arrangements of FIGS. 3 and 4, which can simplify fabrication of the resistive structures 12 of FIGS. 3 and 4 relative to the resistive structures 202 of FIGS. 1 and 2. Further, the complex geometric arrangement of contact regions and resistive regions described with reference to FIG. 1 may be avoided so that the problematic curvaceous outline indicated by dashed-line 203 is no longer problematic. Additionally, the resistive structures 12 of FIGS. 3 and 4 are integrated under the associated capacitive units 14, whereas the resistive structures 202 of FIGS. 1 and 2 are laterally outward of the capacitive units 204. The integration of the resistive structure 12 under the associated capacitive units relative to the embodiments of FIGS. 3 and 4 may enable conservation of valuable semiconductor real estate as compared to the prior art configurations of FIGS. 1 and 2; which may enable the embodiment of FIGS. 3 and 4 to be incorporated into more highly-integrated circuitry than the prior art configurations.

Figure 5:
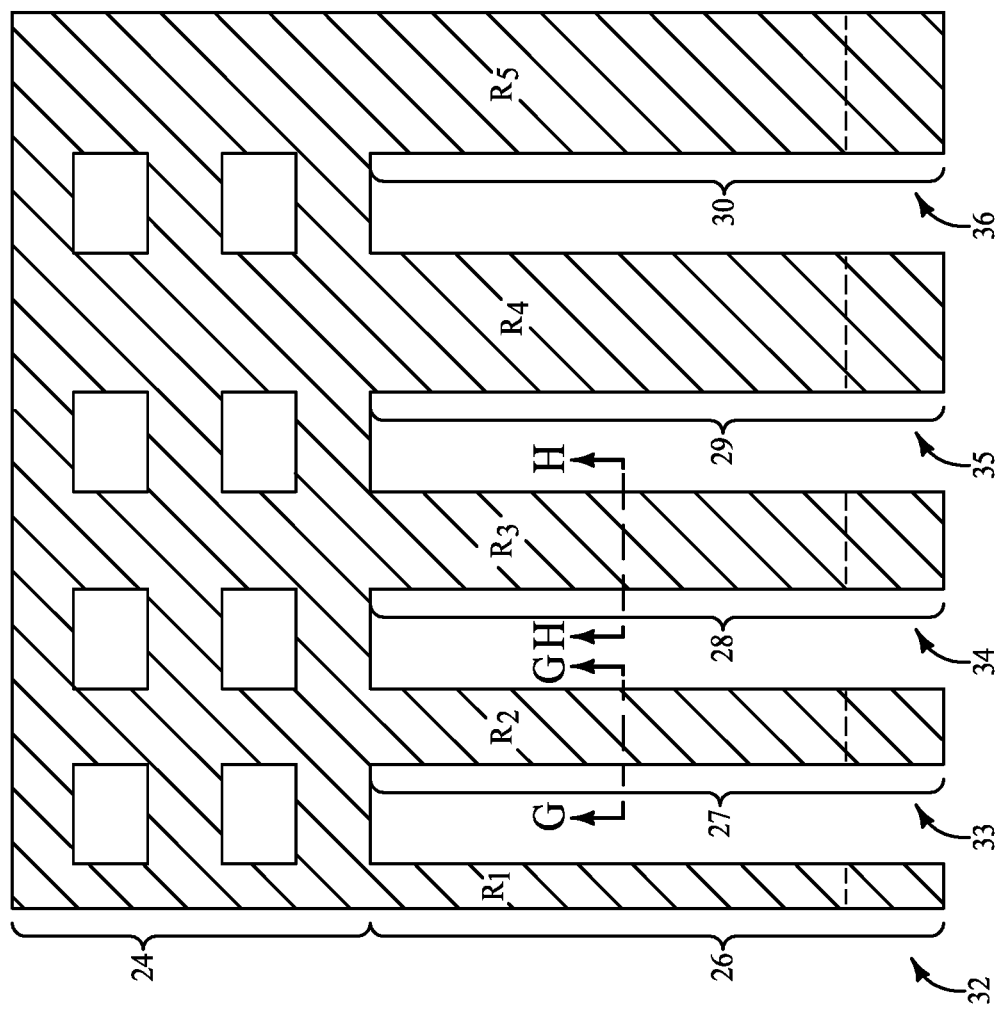
FIG. 5 is a top-down view of another example resistive structure.

Another advantage of the resistive structures 12 described herein can be that the various resistive units may be tailored to achieve different levels of resistivity across some of the units relative to others. For instance, FIG. 5 shows a resistive structure 12a analogous to the structure 12 of FIG. 3D, but in which the various resistive units $R_1$-$R_5$ have different widths relative to one another. Larger dimensions of the resistive units may correspond to lower resistance. The illustrated resistive unit have increasing dimensions (specifically, widths) in the order $R_1$ to $R_5$. Accordingly, the illustrated resistive units may have decreasing resistivity in the order $R_1$ to $R_5$. In some embodiments, some of the resistive units may have same dimensions relative to one another, while others vary relative to one another. The modification of resistance of a specific resistive unit relative to others of the resistive units may enable the resistive structure 12a to be tailored for specific application.

In some embodiments, one or more of the resistive units 26-30 may be chemically modified relative to one or more others of the resistive units 26-30 to modify resistivity amongst the resistive units (e.g., there may be differences in semiconductor materials utilized within the resistive units, differences in dopant composition and/or concentration provided within the resistive units, etc.). The chemical modification may be provided additionally, or alternatively, to the geometric modification.

Figure 5A:
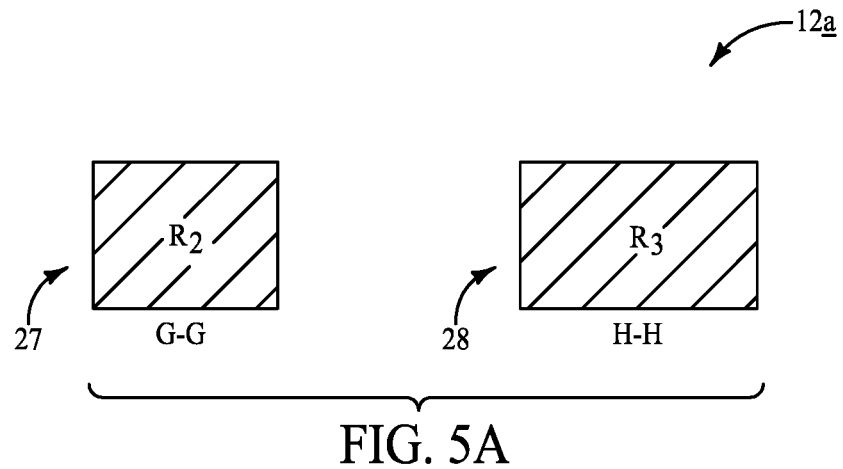
FIG. 5A shows diagrammatic cross-sectional side views along the cross-sections G-G and H-H of FIG. 5 in accordance with an example embodiment.
Figure 5B:
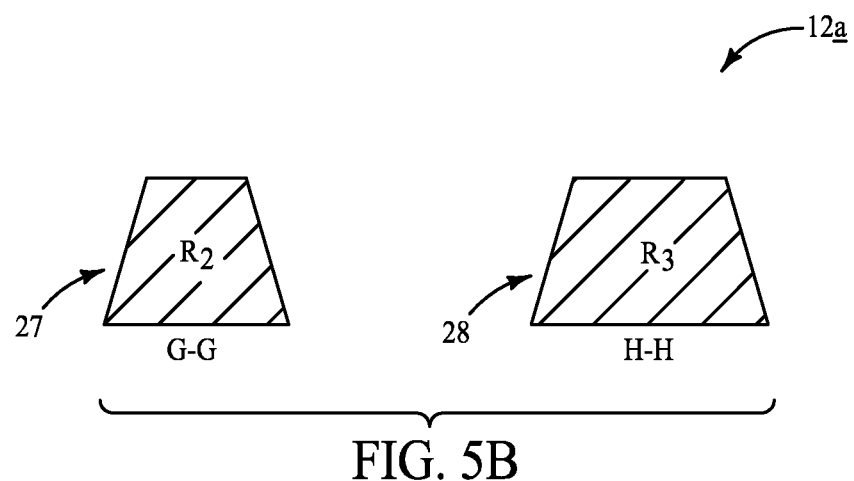
FIG. 5B shows diagrammatic cross-sectional side views along the cross-sections G-G and H-H of FIG. 5 in accordance with another example embodiment.

In some embodiments, difference in resistivity of the resistive units $R_1$-$R_5$ relative to one another may result, at least in part, from differences in cross-sectional areas across the units $R_1$-$R_5$. For instance, FIGS. 5A and 5B show a couple of example embodiments in which the resistive unit $R_2$ has a smaller cross-sectional area than the resistive unit $R_3$.

Figure 6:
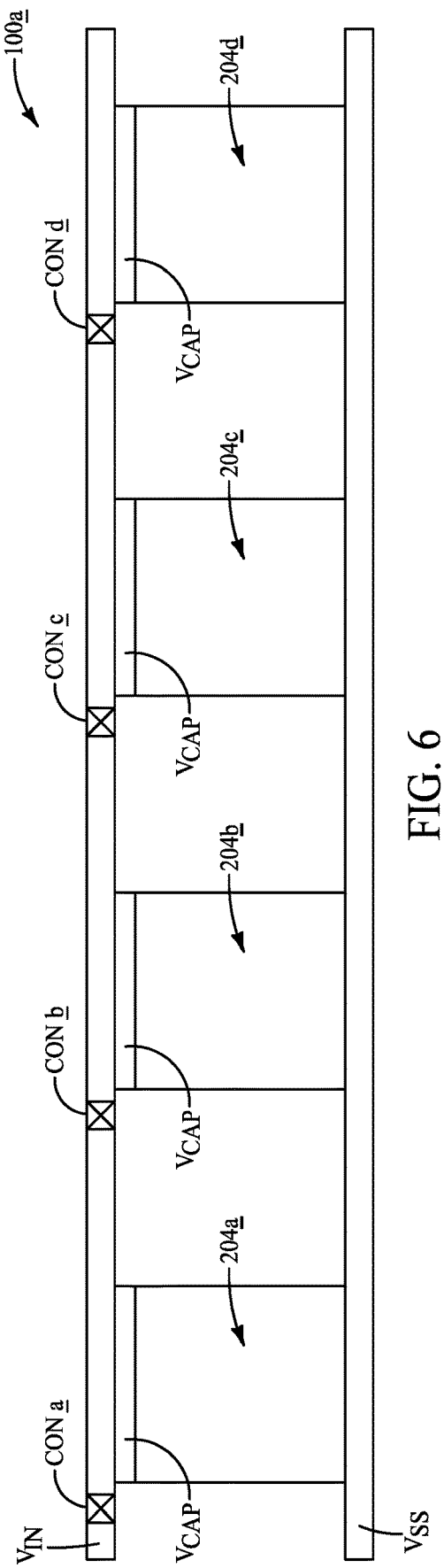
FIG. 6 is a diagrammatic top-down view of a prior art integrated assembly comprising a plurality of capacitive units.
Figure 7:
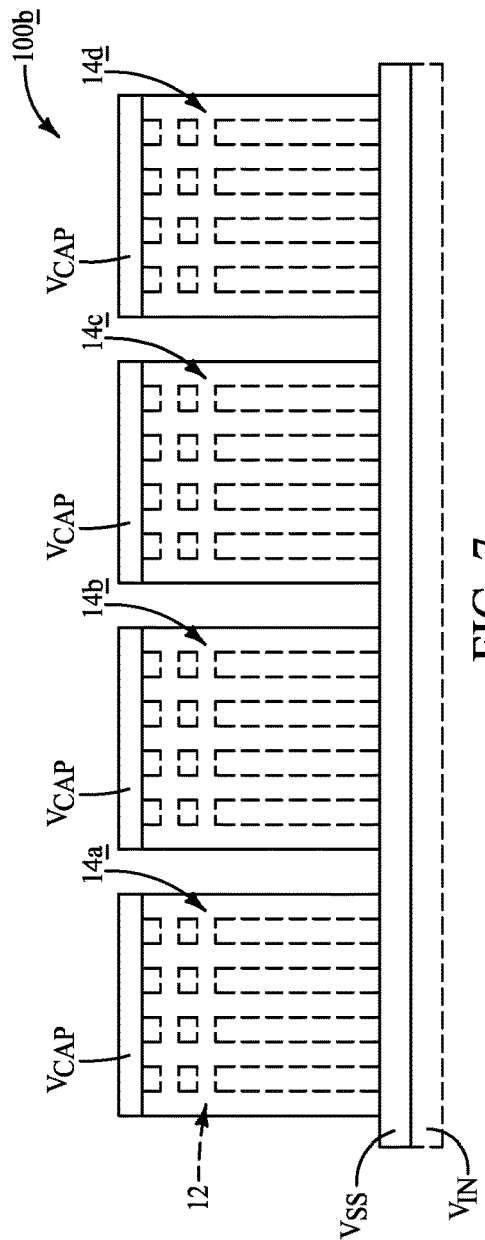
FIG. 7 is a diagrammatic top-down view of an example embodiment integrated assembly comprising a plurality of capacitive units.

As discussed above, an advantage of extending resistive units under capacitive units in accordance with the embodiment of FIGS. 3 and 4 can be that such may enable higher integration to be achieved with architectures fabricated in accordance with embodiments described herein as compared to architectures fabricated utilizing prior art configurations of the type described with reference to FIGS. 1 and 2. FIGS. 6 and 7 compare an architecture 100a fabricated in accordance with the prior art (shown in FIG. 6) with an architecture 100b fabricated utilizing the configuration of FIGS. 3 and 4 (shown in FIG. 7). The architecture 100a comprises a plurality of the capacitive units 204 (shown as 204a-204d), and the architecture 100b comprises a plurality of the capacitive units 14 (shown as 14a-14d). The capacitive units 14a-14d may be considered to be substantially identical to one another; with the term "substantially identical" meaning identical to within reasonable tolerances of fabrication and measurement.

The resistive structures utilized in the architecture 100a are not specifically illustrated in FIG. 6, but regions where the resistive structures are coupled with the input voltage $V_{IN}$ are diagrammatically illustrated as CON1a-CON1d. The resistive structures utilized in the architecture 100a would correspond to resistive structures 202 of the type described above with reference to FIG. 1. The resistive structures of the architecture 100b of FIG. 7 are under the capacitive units 14 and may correspond to resistive structures 12 of the type described with reference to FIG. 3 (e.g., the structure 12 shown in FIG. 3D).

The capacitive units 204 of the prior art architecture 100a are relatively widely spaced from one another in order to provide room for the resistive structures 202 (shown in FIG. 1) provided laterally adjacent such capacitive units. In contrast, the capacitive structures 14 of the architecture 100b may be relatively tightly packed since the resistive structures 12 are primarily under such capacitive structures rather than being laterally adjacent the capacitive structures.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a capacitive unit which includes a plurality of capacitive subunits arranged proximately to one another. The capacitive subunits have respective first electrodes coupled with one another and respective second electrodes coupled with one another, A resistive structure includes at least one resistive line. The capacitive unit and the resistive unit are disposed vertically such that the at least one resistive line and the plurality of capacitive subunits overlap vertically each other.

Some embodiments include an integrated assembly having a capacitive unit which includes a plurality of capacitive subunits. The capacitive subunits are subdivided amongst a first group and a second group. A first conductive structure is under the first group of the capacitive subunits and is coupled with the first group of the capacitive subunits. A second conductive structure is under the second group of the capacitive subunits and is coupled with the second group of the capacitive subunits, and is supplied with a first voltage. A third conductive structure is over the capacitive subunits and is coupled with the first and second groups of the capacitive subunits. A resistive structure extends under the first and second conductive structures. The resistive structure has a first-end-region under the first conductive structure. The first-end-region is coupled with the first conductive structure. The resistive structure includes a plurality of resistive lines extending from the first-end-region to second-end-regions. One or more of the second-end-regions is supplied with a second voltage.

Some embodiments include an integrated assembly comprising a capacitive unit which includes a plurality of capacitive subunits. A conductive level is under the capacitive subunits. The capacitive subunits are subdivided amongst a first group and a second group. A first plate is under the first group of the capacitive subunits along the conductive level, and is coupled with the first group of the capacitive subunits. A second plate is under the second group of the capacitive subunits along the conductive level, is coupled with the second group of the capacitive subunits, and is supplied with a first voltage. The first and second plates are spaced from one another along the conductive level. A common plate extends to couple the first and second groups of the capacitive subunits to one another. A resistive structure extends under the first and second plates. The resistive structure has a wide-end-region under the first plate. The wide-end-region is coupled with the first plate through a plurality of first conductive contacts extending from a bottom of the first plate to the wide-end-region of the resistive structure. The resistive structure comprises a plurality of resistive lines extending from the wide-end-region to input-voltage-contact-regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
a capacitive unit which includes a plurality of capacitive subunits arranged proximately to one another, the capacitive subunits including respective first electrodes coupled with one another and respective second electrodes coupled with one another;
a resistive structure which includes at least one resistive line; and
wherein the capacitive unit and the resistive unit are disposed vertically such that the at least one resistive line and the plurality of capacitive subunits overlap vertically each other.

2. The integrated assembly of claim 1 wherein:
the first electrodes of the plurality of capacitive subunits are coupled to a conductive structure and the second electrodes of the plurality of capacitive subunits are coupled to a conductive plate; and
the at least one resistive line further overlaps vertically the conductive structure and the conductive plate.

3. The integrated assembly of claim 2 wherein:
the conductive plate is supplied with a first voltage; and
the at least one resistive line includes a first end region coupled with the conductive structure and a second end region supplied with a second voltage.

4. The integrated assembly of claim 1,
wherein the capacitive unit further includes a plurality of additional capacitive subunits arranged proximately to one another, the plurality of additional capacitive subunits including respective third electrodes coupled with one another and with the respective first electrodes of the plurality of capacitive subunits, and the plurality of additional capacitive subunits further including respective fourth electrodes coupled with one another and with the respective second electrodes of the plurality of capacitive subunits, and
the resistive structure further includes at least one additional resistive line, the at least one additional resistive line overlaps vertically the plurality of additional capacitive subunits.

5. The integrated assembly of claim 4,
wherein the first electrodes of the plurality of capacitive subunits and the third electrodes of the plurality of additional capacitive subunits are coupled to a conductive structure and the second electrodes of the plurality of capacitive subunits and the fourth electrodes of the plurality of additional capacitive subunits are coupled to a conductive plate;
wherein the conductive plate is supplied with a first voltage;
wherein the at least one resistive line includes a first end region coupled with the conductive structure and a second end region;
wherein the at least one additional resistive line includes a third end region coupled with the conductive structure and a fourth end region; and wherein one or both of the second end region of the at least one resistive line and the fourth end region of the at least one additional resistive line are supplied with a second voltage.

6. The integrated assembly of claim 4,
wherein the first electrodes of the plurality of capacitive subunits and the third electrodes of the plurality of additional capacitive subunits are coupled to a conductive structure and the second electrodes of the plurality of capacitive subunits and the fourth electrodes of the plurality of additional capacitive subunits are coupled to a conductive plate;
wherein the conductive plate is supplied with a first voltage;
wherein the conductive structure is supplied with a second voltage;
wherein the at least one resistive line includes a first end region coupled with the conductive structure and a second end region;
wherein the at least one additional resistive line includes a third end region coupled with the conductive structure and a fourth end region; and
wherein each of the second end region of the at least one resistive line and the fourth end region of the at least one additional resistive line is free from being supplied with the second voltage.

7. An integrated assembly, comprising:
a capacitive unit which includes a plurality of capacitive subunits; the capacitive subunits being subdivided amongst a first group and a second group;
a first conductive structure under the first group of the capacitive subunits and coupled with the first group of the capacitive subunits;
a second conductive structure under the second group of the capacitive subunits and coupled with the second group of the capacitive subunits, the second conductive structure being supplied with a first voltage;
a third conductive structure over the capacitive subunits and coupled the first and second groups of the capacitive subunits; and
a resistive structure extending under the first and second conductive structures; the resistive structure having a first-end-region under the first conductive structure; the first-end-region being coupled with the first conductive structure; the resistive structure comprising a plurality of resistive lines extending from the first-end-region to second-end-regions, one or more of the second-end-regions being supplied with a second voltage.

8. The integrated assembly of claim 7 wherein the first-end-region comprises a lattice; the lattice including first features extending from the resistive lines, and extending along a first direction; the lattice including second features extending between the first features and extending along a second direction which crosses the first direction.

9. The integrated assembly of claim 8 wherein conductive contacts extend from each of the first and second features to the first conductive structure.

10. The integrated assembly of claim 7 wherein the resistive lines are all about a same cross-sectional area as one another.

11. The integrated assembly of claim 7 wherein at least one of the resistive lines is a different cross-sectional area than at least one other of the resistive lines.

12. The integrated assembly of claim 7 wherein the resistive lines are all about a same width as one another.

13. The integrated assembly of claim 7 wherein at least one of the resistive lines is a different width than at least one other of the resistive lines.

14. The integrated assembly of claim 7 wherein the resistive lines of the resistive structure comprise polycrystalline silicon doped with impurities.

15. An integrated assembly, comprising:
a capacitive unit which includes a plurality of capacitive subunits; the capacitive subunits being subdivided amongst a first group and a second group;
a first plate being under the first group of the capacitive subunits along a conductive level that is under the capacitive subunits, and being coupled with the first group of the capacitive subunits;
a second plate being under the second group of the capacitive subunits along the conductive level, and being coupled with the second group of the capacitive subunits; the first and second plates being spaced from one another along the conductive level, the second plate being supplied with a first voltage;
a common plate extending to couple the first and second groups of the capacitive subunits with one another; and
a resistive structure extending under the first and second plates; the resistive structure having a wide-end-region under the first plate; the wide-end-region being coupled with the first plate through a plurality of first conductive contacts extending from a bottom of the first plate to the wide-end-region of the resistive structure; the resistive structure comprising a plurality of resistive lines extending from the wide-end-region to input-voltage-contact-regions.

16. The integrated assembly of claim 15 wherein the resistive lines are all about a same cross-sectional area as one another.

17. The integrated assembly of claim 15 wherein at least one of the resistive lines has a different cross-sectional area than at least one other of the resistive lines.

18. The integrated assembly of claim 15 wherein the resistive lines are all about a same width as one another.

19. The integrated assembly of claim 15 wherein at least one of the resistive lines is a different width than at least one other of the resistive lines.

20. The integrated assembly of claim 15 wherein the wide-end-region comprises a lattice; the lattice including first features extending from the resistive lines, and extending along a first direction; the lattice including second features extending between the first features and extending along a second direction which crosses the first direction.

21. The integrated assembly of claim 20 wherein the second direction is substantially orthogonal to the first direction.

22. The integrated assembly of claim 20 wherein the first conductive contacts are subdivided amongst sets; and wherein each of the first features has an associated one of the sets of the first conductive contacts, and is directly coupled with the first plate through said associated one of the sets of the first conductive contacts.

23. The integrated assembly of claim 22 wherein each of the second features has an associated one of the sets of the first conductive contacts, and is directly coupled with the first plate through said associated one of the sets of the first conductive contacts.

24. The integrated assembly of claim 15, further comprising a first interconnect provided along an additional conductive level that is higher than the capacitive subunits, the first interconnect being coupled to the first plate.

25. The integrated assembly of claim 24, further comprising:
- a third plate provided along the conductive level and supplied with a second voltage, the input-voltage-contact-regions not being supplied with the second voltage; and
- a second interconnect provided along the additional conductive level and coupled to the third plate.

* * * * *